(12) United States Patent
Ochiai et al.

(10) Patent No.: US 12,310,251 B2
(45) Date of Patent: May 20, 2025

(54) MAGNETORESISTANCE MEMORY DEVICE AND METHOD OF MANUFACTURING MAGNETORESISTANCE MEMORY DEVICE

(71) Applicant: Kioxia Corporation, Tokyo (JP)

(72) Inventors: Takao Ochiai, Seoul (KR); Kenichi Yoshino, Seongnam-si (KR); Kazuya Sawada, Seoul (KR); Naoki Akiyama, Seoul (KR)

(73) Assignee: Kioxia Corporation, Tokyo (JP)

( * ) Notice: Subject to any disclaimer, the term of this patent is extended or adjusted under 35 U.S.C. 154(b) by 777 days.

(21) Appl. No.: 17/471,327

(22) Filed: Sep. 10, 2021

(65) Prior Publication Data

US 2022/0093847 A1  Mar. 24, 2022

(30) Foreign Application Priority Data

Sep. 18, 2020 (JP) ................. 2020-157296

(51) Int. Cl.
*H10N 50/80* (2023.01)
*G11C 11/16* (2006.01)
*H10B 61/00* (2023.01)
*H10N 50/01* (2023.01)

(52) U.S. Cl.
CPC ........... *H10N 50/80* (2023.02); *G11C 11/161* (2013.01); *H10B 61/10* (2023.02); *H10N 50/01* (2023.02)

(58) Field of Classification Search
CPC ........ H10B 63/20; H10B 63/22; H10B 63/24; H10B 63/80; H10B 63/84; H10B 99/16; H10B 61/10
See application file for complete search history.

(56) References Cited

U.S. PATENT DOCUMENTS

| | | |
|---|---|---|
| 8,995,181 B2 | 3/2015 | Watanabe et al. |
| 9,130,143 B2 | 9/2015 | Nagase et al. |
| 9,142,756 B2 | 9/2015 | Nagamine et al. |
| 9,184,374 B2 | 11/2015 | Sawada et al. |
| 9,209,386 B2 | 12/2015 | Nagamine et al. |
| 9,252,357 B2 | 2/2016 | Watanabe et al. |
| 9,269,890 B2 | 2/2016 | Nakayama et al. |

(Continued)

OTHER PUBLICATIONS

U.S. Appl. No. 17/199,593, First Named Inventor: Kenichi Yoshino; Title: "Magnetic Memory Device and Method for Manufacturing the Same", filed Mar. 12, 2021.

(Continued)

*Primary Examiner* — Kretelia Graham
*Assistant Examiner* — Jaesun Lee
(74) *Attorney, Agent, or Firm* — Holtz, Holtz & Volek PC

(57) ABSTRACT

In general, according to one embodiment, a magnetoresistance memory device includes: a first conductor; a silicon oxide on the first conductor; a second conductor; a first layer stack on the second conductor. The silicon oxide includes a dopant and has a first part on the first conductor and a second part adjacent to the first part on the first conductor. The second part is higher than the first part. A concentration of the dopant of the second part being higher than a concentration of the dopant of the first part. The second conductor is on the second part of the silicon oxide. The first layer stack includes a first magnetic layer, a second magnetic layer, and a first insulating layer between the first magnetic layer and the second magnetic layer.

9 Claims, 26 Drawing Sheets

(56) References Cited

U.S. PATENT DOCUMENTS

| | | | |
|---|---|---|---|
| 9,293,695 B2 | 3/2016 | Ueda et al. | |
| 9,461,240 B2 | 10/2016 | Sawada et al. | |
| 9,466,350 B2 | 10/2016 | Murayama et al. | |
| 9,620,561 B2 | 4/2017 | Nagase et al. | |
| 9,640,584 B2 | 5/2017 | Nagamine et al. | |
| 9,705,076 B2 | 7/2017 | Nagamine et al. | |
| 9,741,928 B2 | 8/2017 | Ueda et al. | |
| 9,947,862 B2 | 4/2018 | Watanabe et al. | |
| 9,960,350 B2* | 5/2018 | Ha | H10N 70/826 |
| 9,991,313 B2 | 6/2018 | Watanabe et al. | |
| 10,026,888 B2 | 7/2018 | Ochiai et al. | |
| 10,026,891 B2 | 7/2018 | Nagase et al. | |
| 10,090,459 B2 | 10/2018 | Watanabe et al. | |
| 10,103,318 B2 | 10/2018 | Watanabe et al. | |
| 10,170,519 B2 | 1/2019 | Eeh et al. | |
| 10,199,568 B2 | 2/2019 | Nagamine et al. | |
| 10,263,178 B2 | 4/2019 | Sawada et al. | |
| 10,325,640 B2 | 6/2019 | Kishi et al. | |
| 10,388,343 B2 | 8/2019 | Oikawa et al. | |
| 10,468,170 B2 | 11/2019 | Eeh et al. | |
| 10,510,950 B2 | 12/2019 | Watanabe et al. | |
| 10,840,434 B2 | 11/2020 | Kitagawa et al. | |
| 10,847,576 B2 | 11/2020 | Tsubata et al. | |
| 10,873,021 B2 | 12/2020 | Eeh et al. | |
| 10,910,032 B2 | 2/2021 | Kishi et al. | |
| 11,127,445 B2 | 9/2021 | Eeh et al. | |
| 2014/0284534 A1 | 9/2014 | Nagase et al. | |
| 2014/0284733 A1 | 9/2014 | Watanabe et al. | |
| 2015/0068887 A1 | 3/2015 | Nagamine et al. | |
| 2015/0069544 A1 | 3/2015 | Nagamine et al. | |
| 2015/0069554 A1 | 3/2015 | Nakayama et al. | |
| 2015/0259788 A1 | 9/2015 | Nagamine et al. | |
| 2016/0099408 A1 | 4/2016 | Nagamine et al. | |
| 2016/0130693 A1 | 5/2016 | Sawada et al. | |
| 2017/0263679 A1 | 9/2017 | Ozeki et al. | |
| 2017/0263680 A1 | 9/2017 | Yoshino et al. | |
| 2018/0019281 A1 | 1/2018 | Lee et al. | |
| 2018/0076262 A1 | 3/2018 | Eeh et al. | |
| 2018/0205006 A1 | 7/2018 | Watanabe et al. | |
| 2018/0269043 A1 | 9/2018 | Jeda et al. | |
| 2018/0277745 A1 | 9/2018 | Oikawa et al. | |
| 2018/0309048 A1 | 10/2018 | Ochiai et al. | |
| 2018/0366642 A1 | 12/2018 | Yang et al. | |
| 2019/0019841 A1 | 1/2019 | Eeh et al. | |
| 2019/0287706 A1 | 9/2019 | Shiokawa | |
| 2020/0075671 A1 | 3/2020 | Ozeki et al. | |
| 2020/0083285 A1 | 3/2020 | Nagase et al. | |
| 2020/0127046 A1* | 4/2020 | Lai | H10N 50/80 |
| 2020/0294567 A1 | 9/2020 | Oikawa et al. | |
| 2020/0302987 A1 | 9/2020 | Sawada et al. | |
| 2021/0074908 A1 | 3/2021 | Oikawa et al. | |
| 2021/0074911 A1 | 3/2021 | Isoda et al. | |
| 2021/0083170 A1 | 3/2021 | Sawada et al. | |
| 2021/0287727 A1 | 9/2021 | Tsubata et al. | |
| 2021/0287728 A1 | 9/2021 | Isoda et al. | |
| 2021/0288240 A1 | 9/2021 | Sawada et al. | |
| 2021/0288243 A1 | 9/2021 | Ochiai et al. | |

OTHER PUBLICATIONS

U.S. Appl. No. 17/349,203, First Named Inventor: Naoki Akiyama; Title: "Magnetoresistance Memory Device and Method of Manufacturing Magnetoresistance Memory Device", filed Jun. 16, 2021.

U.S. Appl. No. 17/389,399, First Named Inventor: Taiga Isoda; Title: "Magnetoresistance Memory Device", filed Jul. 30, 2021.

U.S. Appl. No. 17/471,340, First Named Inventor: Kazuya Sawada; Title: "Magnetic Memory Device", filed Sep. 10, 2021.

U.S. Appl. No. 17/472,056, First Named Inventor: Tadaaki Oikawa; Title: "Magnetic Memory Device", filed Sep. 10, 2021.

U.S. Appl. No. 17/472,131, First Named Inventor: Eiji Kitagawa; Title: "Magnetic Memory Device", filed Sep. 10, 2021.

U.S. Appl. No. 17/472,395, First Named Inventor: Naoki Akiyama; Title: "Magnetoresistance Memory Device and Method of Manufacturing Magnetoresistance Memory Device", filed Sep. 10, 2021.

U.S. Appl. No. 17/472,414, First Named Inventor: Kenichi Yoshino; Title: "Magnetic Memory Device and Manufacturing Method of Magnetic Memory Device", filed Sep. 10, 2021.

* cited by examiner

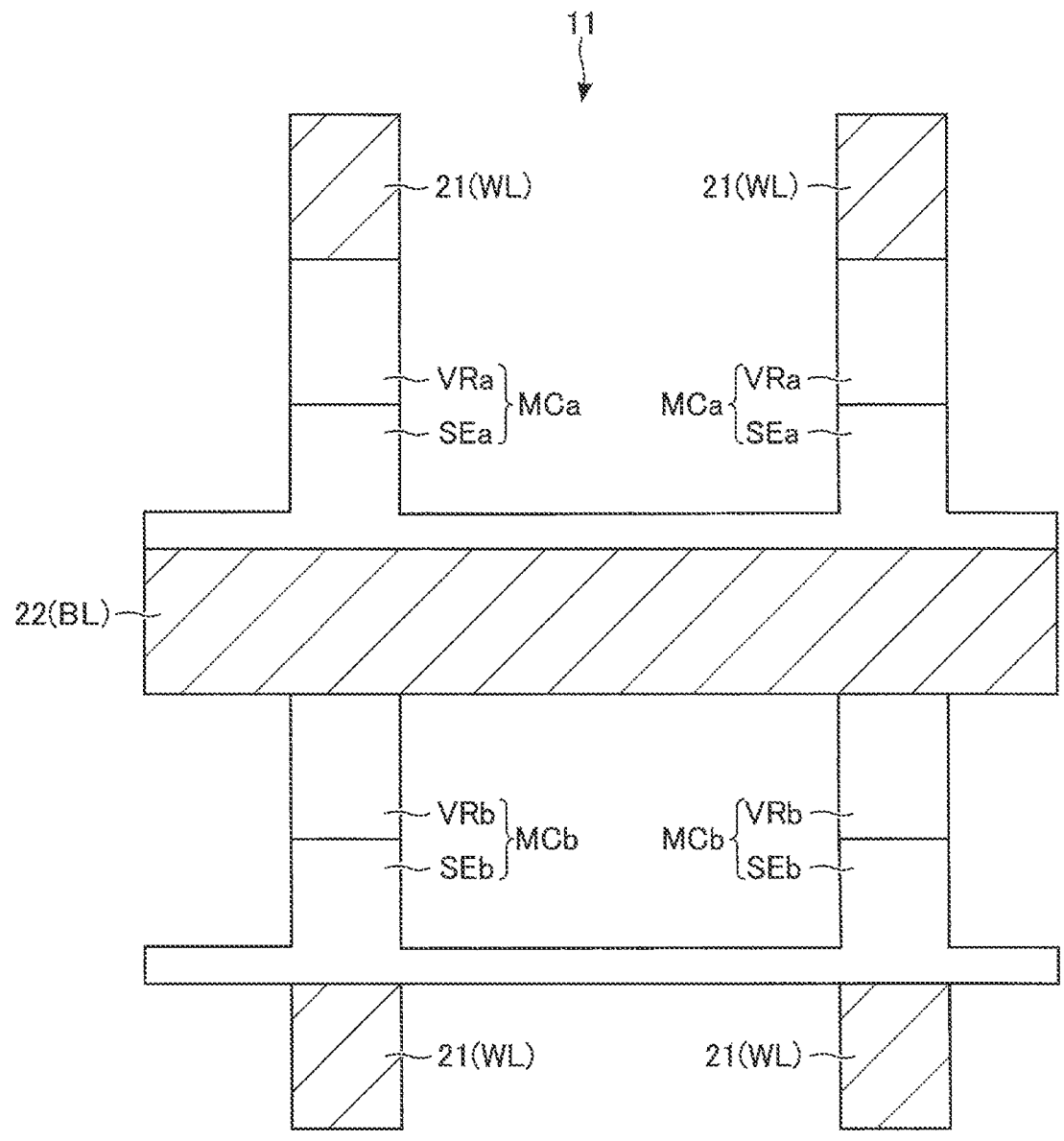
F I G. 3

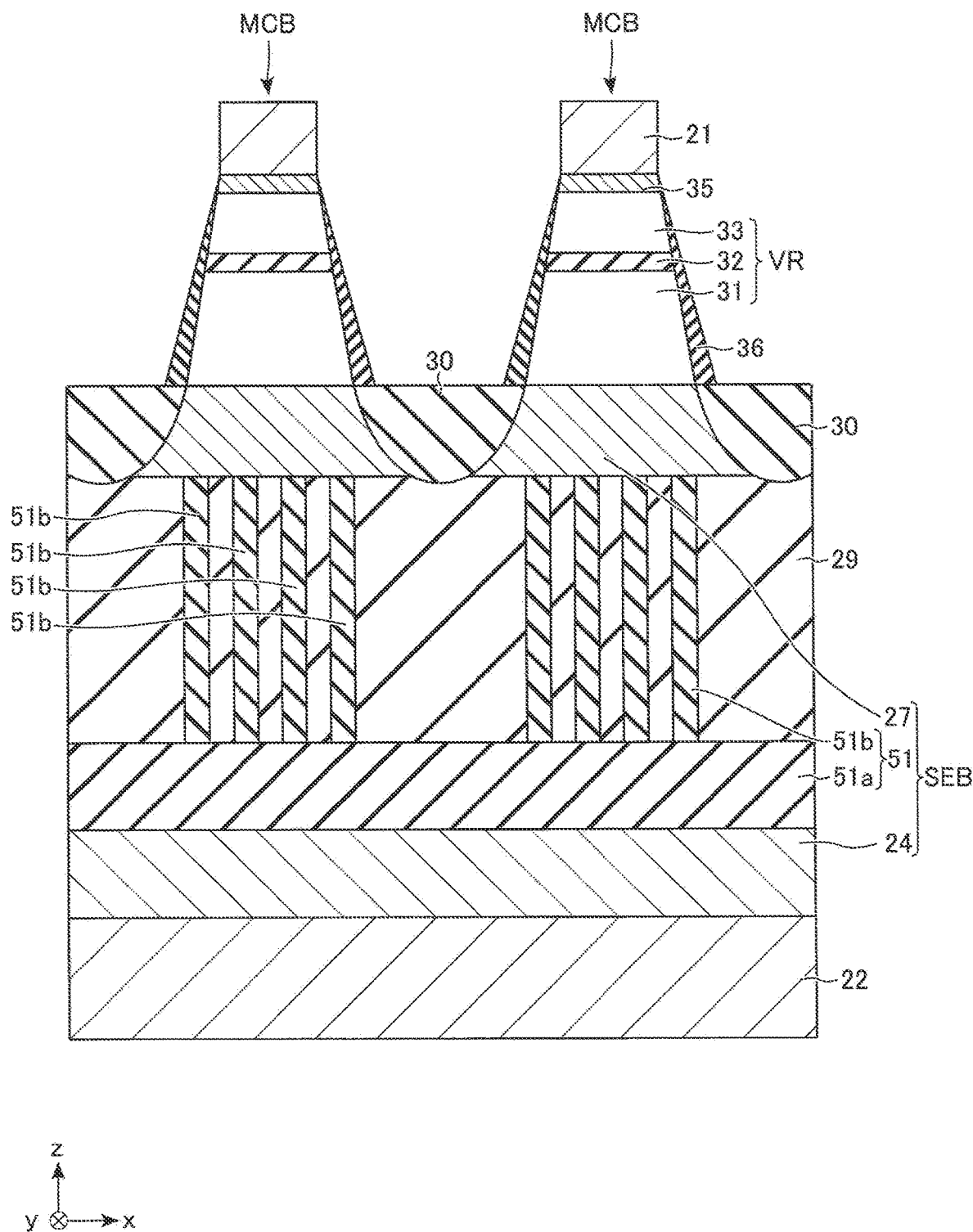
F I G. 17

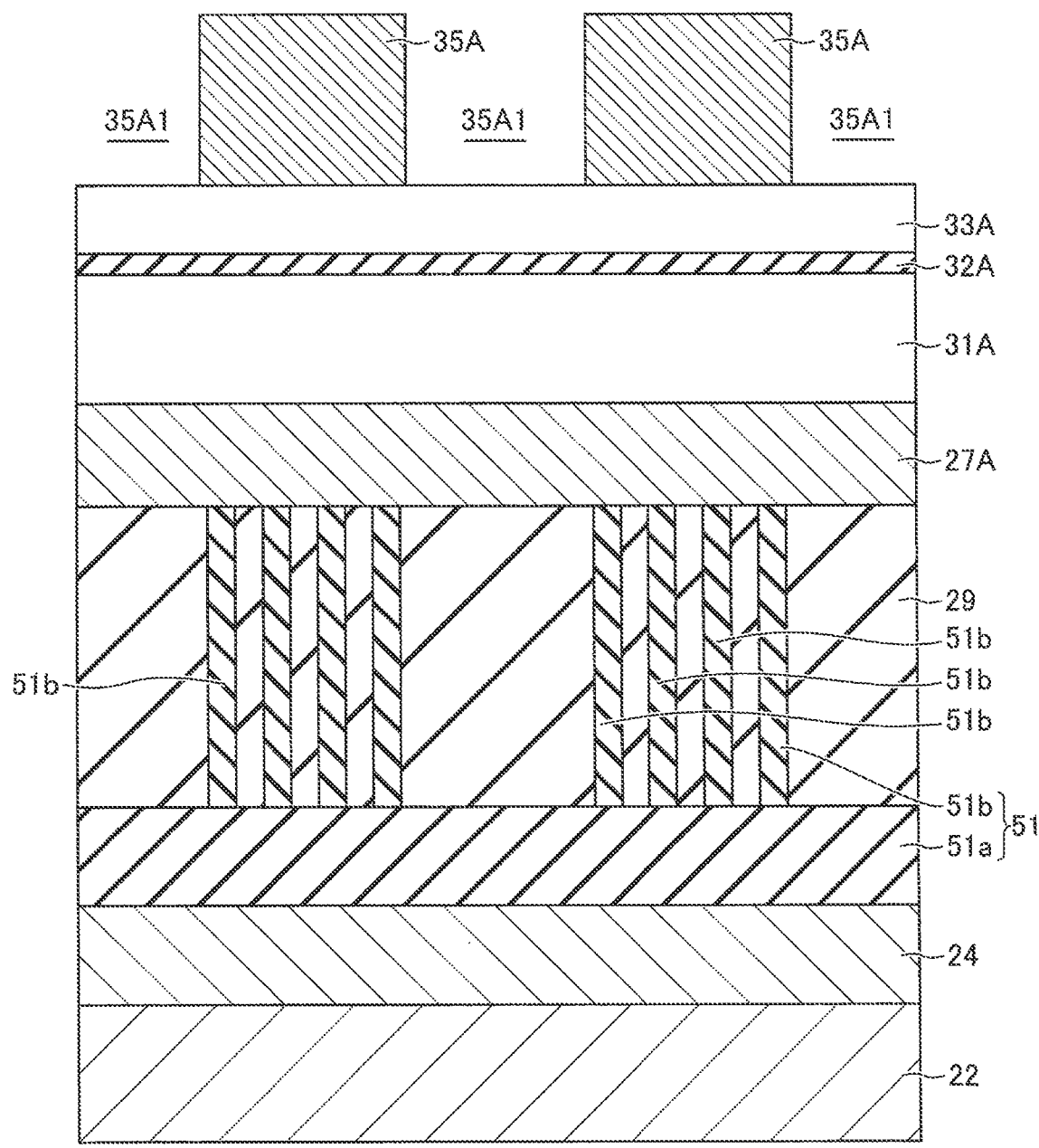
F I G. 23

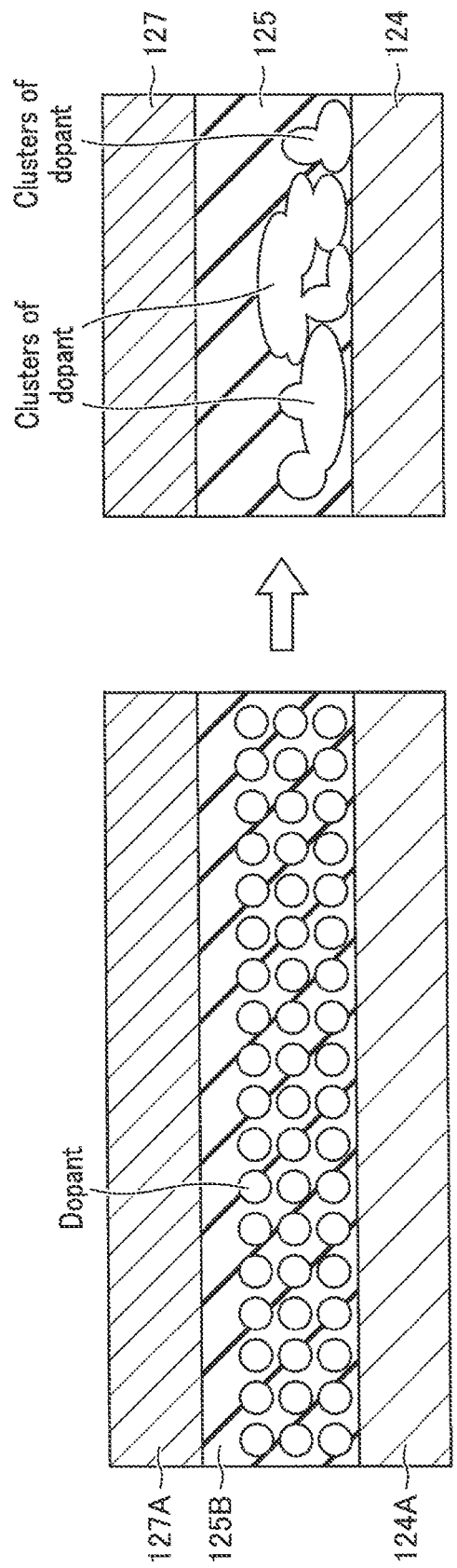
F I G. 24

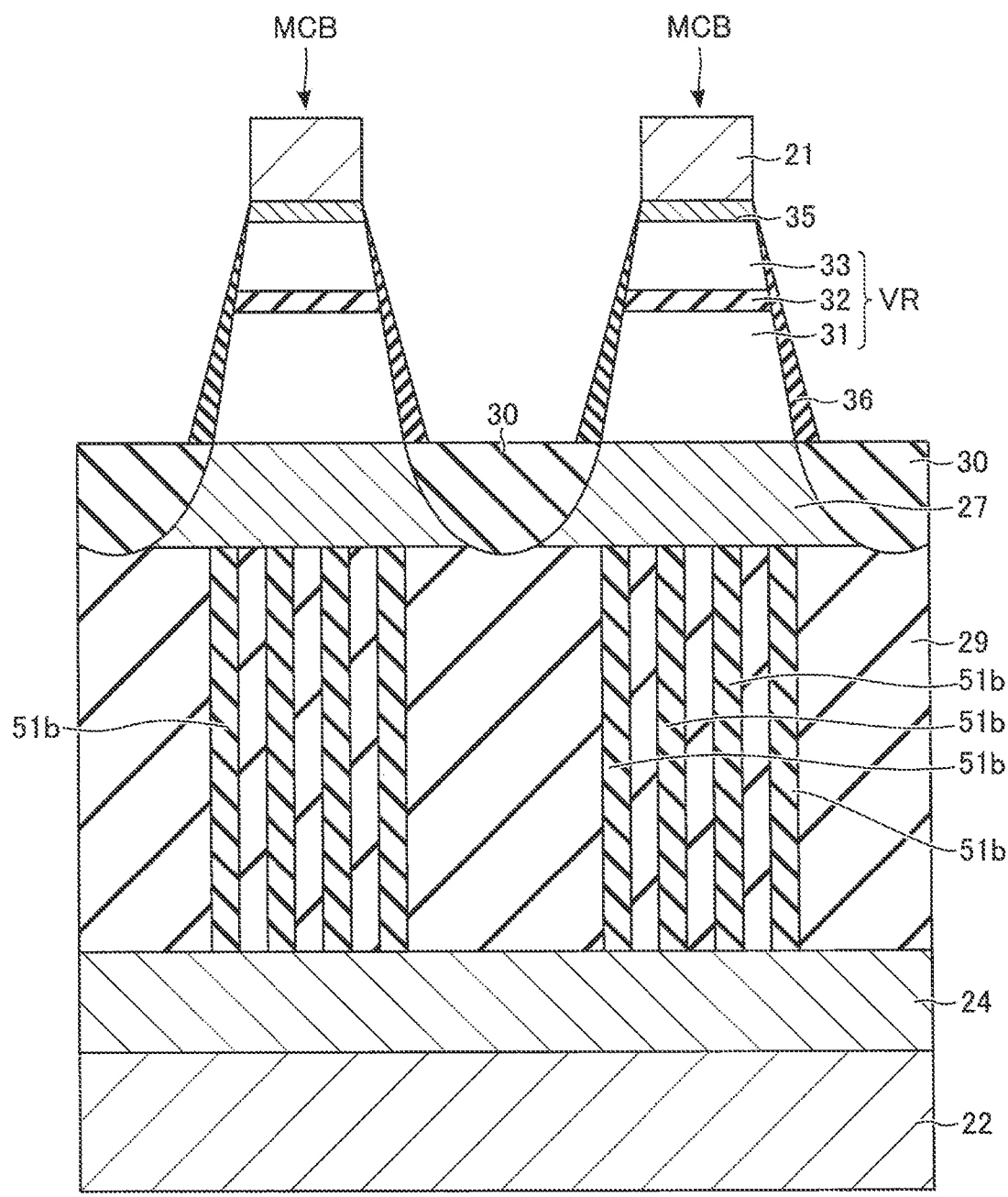
F I G. 25

MAGNETORESISTANCE MEMORY DEVICE AND METHOD OF MANUFACTURING MAGNETORESISTANCE MEMORY DEVICE

CROSS-REFERENCE TO RELATED APPLICATIONS

This application is based upon and claims the benefit of priority from Japanese Patent Application No. 2020-157296, filed Sep. 18, 2020, the entire contents of Which are incorporated herein by reference.

FIELD

Embodiments described herein relate generally to a magnetoresistance memory device and a method of manufacturing a magnetoresistance memory device.

BACKGROUND

Memory devices using a magnetoresistance effect element are known.

BRIEF DESCRIPTION OF THE DRAWINGS

FIG. 3 shows a cross-sectional structure of part of the memory cell array according to the first embodiment.

FIG. 17 shows a cross section of an exemplary structure of memory cells according to a second embodiment.

FIG. 23 shows a structure at a point in time subsequent to that shown in FIG. 22.

FIG. 24 shows a state change of a variable resistance material of a reference magnetoresistance memory device in a manufacturing process.

FIG. 25 shows a cross section of an exemplary structure of a magnetoresistance memory device of a first modification of the second embodiment.

DETAILED DESCRIPTION

Figure 1:
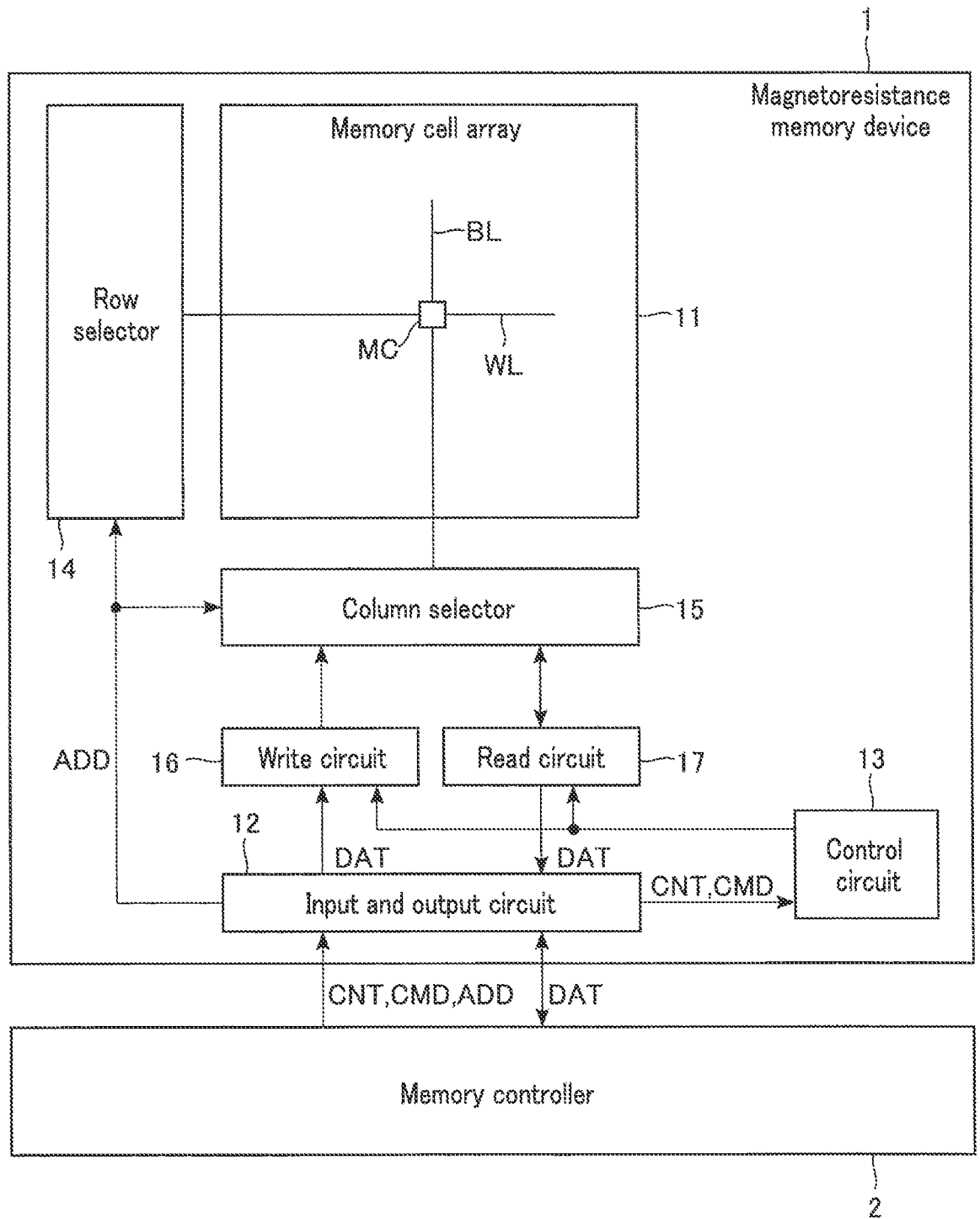
FIG. 1 shows functional blocks of a memory device according to a first embodiment.

In general, according to one embodiment, a magnetoresistance memory device includes: a first conductor; a silicon oxide on the first conductor; a second conductor; a first layer stack on the second conductor. The silicon oxide includes a dopant and has a first part on the first conductor and a second part adjacent to the first part on the first conductor. The second part is higher than the first part. A concentration of the dopant of the second part being higher than a concentration of the dopant of the first part. The second conductor is on the second part of the silicon oxide. The first layer stack includes a first magnetic layer, a second magnetic layer, and a first insulating layer between the first magnetic layer and the second magnetic layer.

Embodiments will now be described with reference to the figures. In the following description, components with substantially the same functionalities and configurations will be referred to by the same reference numerals, and repeated descriptions may be omitted. In order to distinguish components having substantially the same function and configuration from each other, an additional numeral or letter may be added to the end of each reference numeral.

The figures are schematic, and the relation between the thickness and the area of a plane of a layer and the ratio of thicknesses of layers may differ from those in actuality. The figures may include components which differ in relations and/or ratios of dimensions in different figures. The entire description of a particular embodiment also applies to another embodiment unless explicitly mentioned otherwise or obviously eliminated. Each embodiment illustrates a device and a method for materializing the technical idea of that embodiment, and the technical idea each embodiment does not limit the quality of the material, shape, structure, arrangement of components, etc. to those that will be described below.

In the specification and the claims, when a particular first component is expressed as being "coupled" to another second component, the first component may be coupled to the second component either directly or via one or more components which are always or selectively conductive.

The embodiments will be described by using an xyz orthogonal coordinate system. In the description below, the term "below" as well as the terms derived therefrom and the terms related thereto refer to a position having a smaller coordinate on the z-axis, and the term "above" as well as the terms derived therefrom and the terms related thereto refer to a position having a larger coordinate on the z-axis.

1. First Embodiment

1.1. Structure (Configuration)

1.1.1. Overall Structure

FIG. 1 shows functional blocks of a magnetoresistance memory device according to a first embodiment. As shown in FIG. 1, a magnetoresistance memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cells MC can store data in a non-volatile manner. Each memory cell MC is coupled to a single word line WL and a single bit line BL. Each word line WL is associated with a row. Each bit line BL is associated with a column. Selection of one row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selector 14 receives the address signal ADD from the input and output circuit 12, and brings a single word line WL associated with the row that is specified by the received address signal ADD into a selected state.

The column selector 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on a control instructed by the control signal CNT and the command CMD. Specifically, the control circuit 13 supplies voltages used for data writing to the write circuit 16 during the data writing to the memory cell array 11. Further, the control circuit 13 supplies voltages used for data reading to the read circuit 17 during the reading of data from the memory cell array 11.

The write circuit 16 receives write data DAT from the input and output circuit 12 and supplies the voltages for data writing to the column selector 15 based on the control by the control circuit 13 and the write data DAT.

The read circuit 17 includes a sense amplifier, and based on the control of the control circuit 13, uses the voltages for data reading to determine data stored in the memory cells MC. The determined data is supplied to the input and output circuit 12 as the read data DAT.

1.1.2. Circuit Configuration of Memory Cell Array

Figure 2:
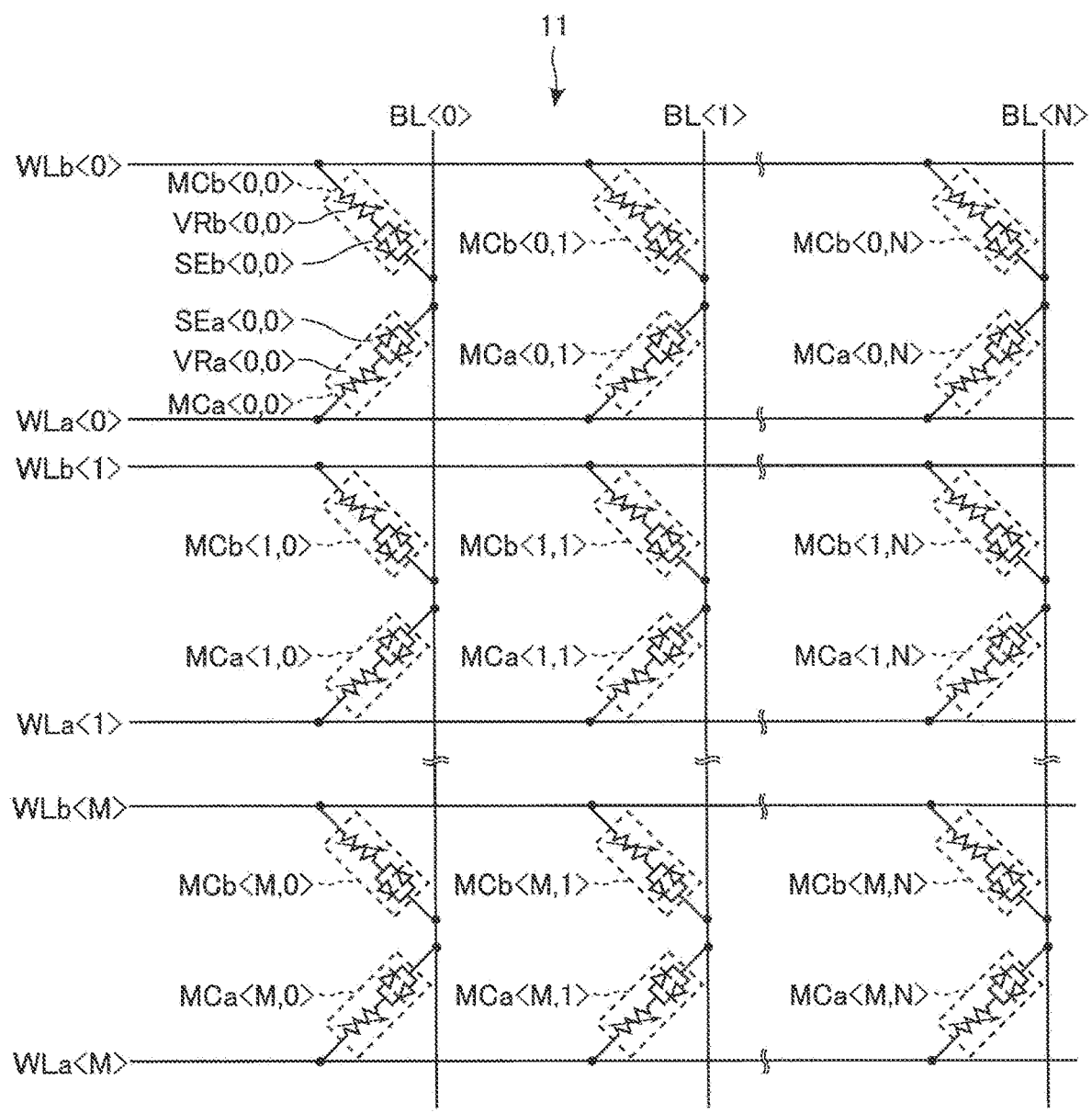
FIG. 2 is a circuit diagram of a memory cell array accord to the first embodiment.

FIG. 2 is a circuit diagram of a memory cell array 11 according to the first embodiment. As shown in FIG. 2, the memory cell array 11 includes (M+1) word lines WLa (WLa<0>, WLa<1>, ..., and WLa<M>) and (M+1) word lines WLb (WLb<0>, WLb<2>, ..., and WLb<M>), where M is a natural number. The memory cell array 11 also includes (N+1) bit lines BL (BL<0>, BL<1>, ..., and BL<N>), where N is a natural number.

Each of the memory cells MC (MCa and MCb) includes two nodes, and is coupled, at its first node, to a single word line WL and coupled, at its second node, to a single bit line BL. More specifically, the memory cells MCa encompass memory cells MCa<α, β> for all, combinations of α and β, where α is every integer equal to or greater than 0 and equal to or less than M, and β is every integer equal to or greater than 0 and equal to or less than N, and the memory cell MCa<α, β> is coupled between the word line WLa<α> and the bit line BL<β>. Similarly, the memory cells MCb encompass memory cells MCb<α, β>, for all combinations of α and β, where α is every integer equal to or greater than 0 and equal to or less than M, and β is every integer equal to or greater than 0 and equal to or less than N, and the memory cell MCb<α, β> is coupled between the word line WLb<α> and the bit line BL<β>.

Each memory cell MC includes a single magnetoresistance effect element VR (VRa or VRb) and a single switching element SE (SEa or SEb). More specifically, the memory cell MCa<α, β> includes a magnetoresistance effect element VRa<α, β> and a switching element SEa<α, β> for all combinations of α and β, where α is every integer equal to or greater than 0 and equal to or less than M, and β is every integer equal to or greater than 0 and equal to or less than N. Each memory cell MCb<α, β> includes a magnetoresistance effect element VRb<α, β> and a switching element SEb<α, β> for all combinations of α and β, where α is every integer equal to or greater than 0 and equal to or less than M, and β is every integer equal to or greater than 0 and equal to or less than N.

In each memory cell MC, the magnetoresistance effect element VR and the switching element SE are coupled in series. The magnetoresistance effect element VR is coupled to a single word line WL, and the switching element SE is coupled to a single bit line BL.

The magnetoresistance effect element VR can switch between a low-resistance state and a high-resistance state. The magnetoresistance effect element VR can store 1-bit data, using the difference in the two resistance states. The switching element SE can be a switching element described below, for example. The switching element includes two terminals, and, when a voltage smaller than a first threshold is applied in a first direction between the two terminals, the switching element is in a high-resistance state, i.e., electrically non-conductive (in an OFF state). In contrast, when a voltage equal to or greater than a first threshold is applied in the first direction between the two terminals, the switching element is in a low-resistance state, i.e., electrically conductive (in an ON state). The switching element is further equipped with a function similar to that of switching between the high-resistance state and the low-resistance state based on the magnitude of the voltage applied in the first direction, with respect to a second direction opposite to the first direction. By turning on or off the switching element, it is possible to perform control on whether or not to supply a current to a magnetoresistance effect element VR coupled to the switching element, namely, whether or not to select the magnetoresistance effect element VR.

1.1.3. Structure of Memory Cell Array

Figure 4:
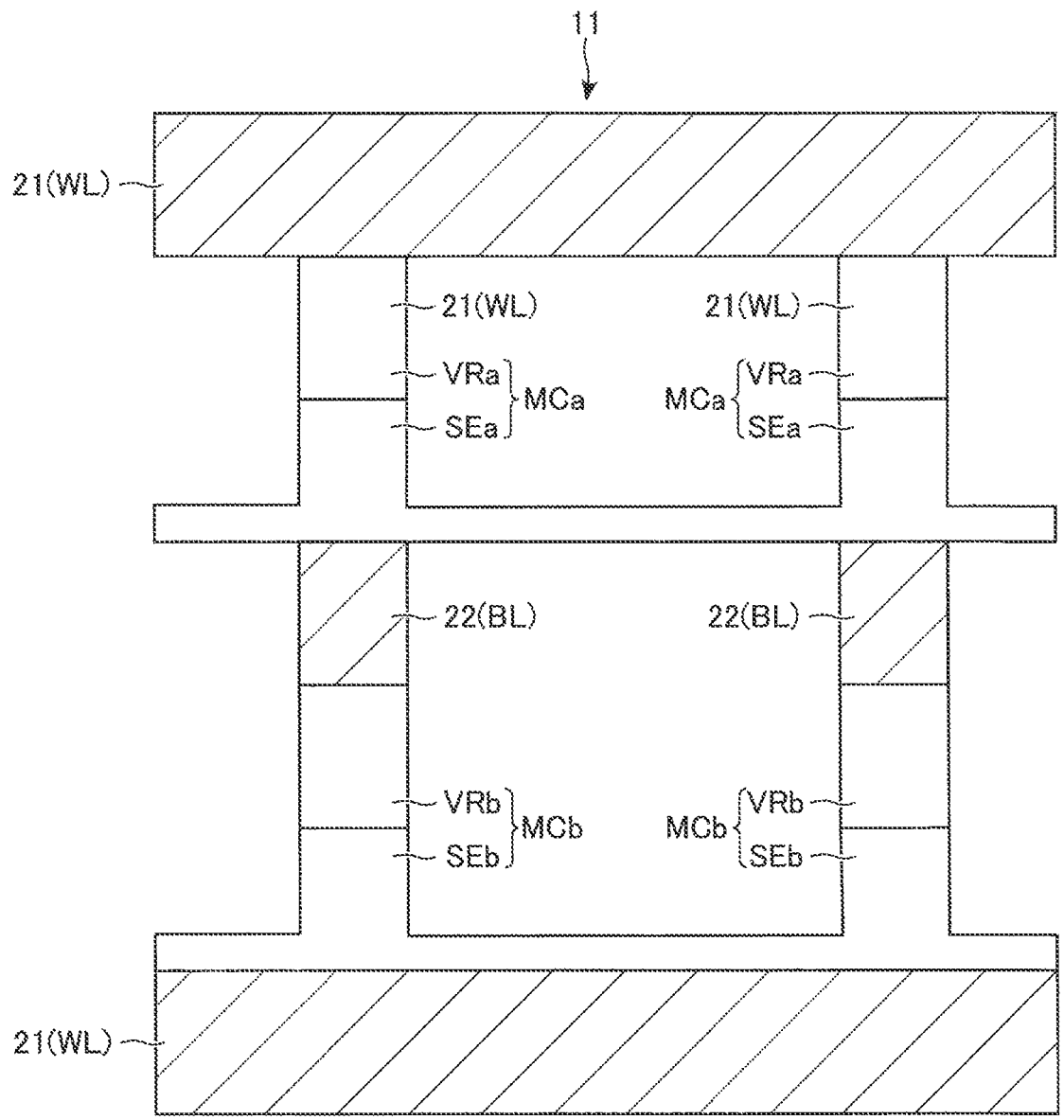
FIG. 4 shows a cross-sectional structure of part of the memory cell array according to the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane.

As shown in FIGS. 3 and 4, conductors 21 are provided above the semiconductor substrate (not shown). The conductors 21 extend along the y-axis, and are aligned along the x-axis. Each conductor 21 functions as a word line WL.

Each conductor 21 is coupled, at its upper surface, to the lower surfaces of memory cells MCb.

The memory cells MCb are aligned along the y-axis on each conductor 21, and this arrangement provides a matrix of memory cells MCb over the xy-plane. Each memory cell MCb includes a structure that functions as a switching element SEb and a structure that functions as a magnetoresistance effect element VRb. The structure that functions as a switching element SEb and the structure that functions as a magnetoresistance effect element VRb each have one or more layers, as will be described later. The structure that functions as a switching element SEb is coupled, at its lower portion including the lower surface, to the lower portion of the structure that functions as another switching element SEb. As a result, a set of lower portions of the structure that functions as multiple switching elements SEb extends across the xy plane as one piece. On the other hand, the upper portion including the upper surface in the structure that functions as a switching element SEb is independent from the structure that functions as another switching element SEb.

Conductors 22 are provided above the memory cells MCb. The conductors 22 extend along the x-axis, and are aligned along the y-axis. Each conductor 22 is coupled, at its lower surface, to the upper surfaces of memory cells MCb aligned along the x-axis. Each conductor 22 functions as a bit line BL. Each conductor 22 is coupled, at its upper surface, to the lower surfaces of memory cells MCa. The memory cells MCa are aligned along the x-axis on each conductor 22, and this arrangement provides a matrix of memory cells MCa over the xy-plane. Each memory cell MCa includes a structure that functions as a switching element SEa and a structure that functions as a magnetoresistance effect element VRa. The structure that functions as a switching element SEa and the structure that functions as a magnetoresistance effect element VRa each have one or more layers, as will be described later. The structure that functions as a switching element SEa is coupled, at its lower portion including the lower surface, to the lower portion of the structure that functions as another switching element SEa. As a result, a set of lower portions of the structures that function as multiple switching elements SEa extends across the xy plane as one piece. On the other hand, the upper portion including the upper surface in the structure that functions as a switching element SEa is independent from the structure that functions as another switching element SEa.

A further conductor 21 is provided on the upper surfaces of memory cells MCa aligned along the y-axis. The structure from the layer of the lowermost conductor 21 to the layer of the memory cell MCa shown in FIGS. 3 and 4 is repeatedly provided along the z axis, thereby making it possible to implement the memory cell array 11 shown in FIG. 2. The memory cell array 11 further includes an interlayer insulator in a region where none of the conductors 21 and 22 and the memory cell MC are provided.

1.1.4. Structure of Memory Cell

Figure 5:
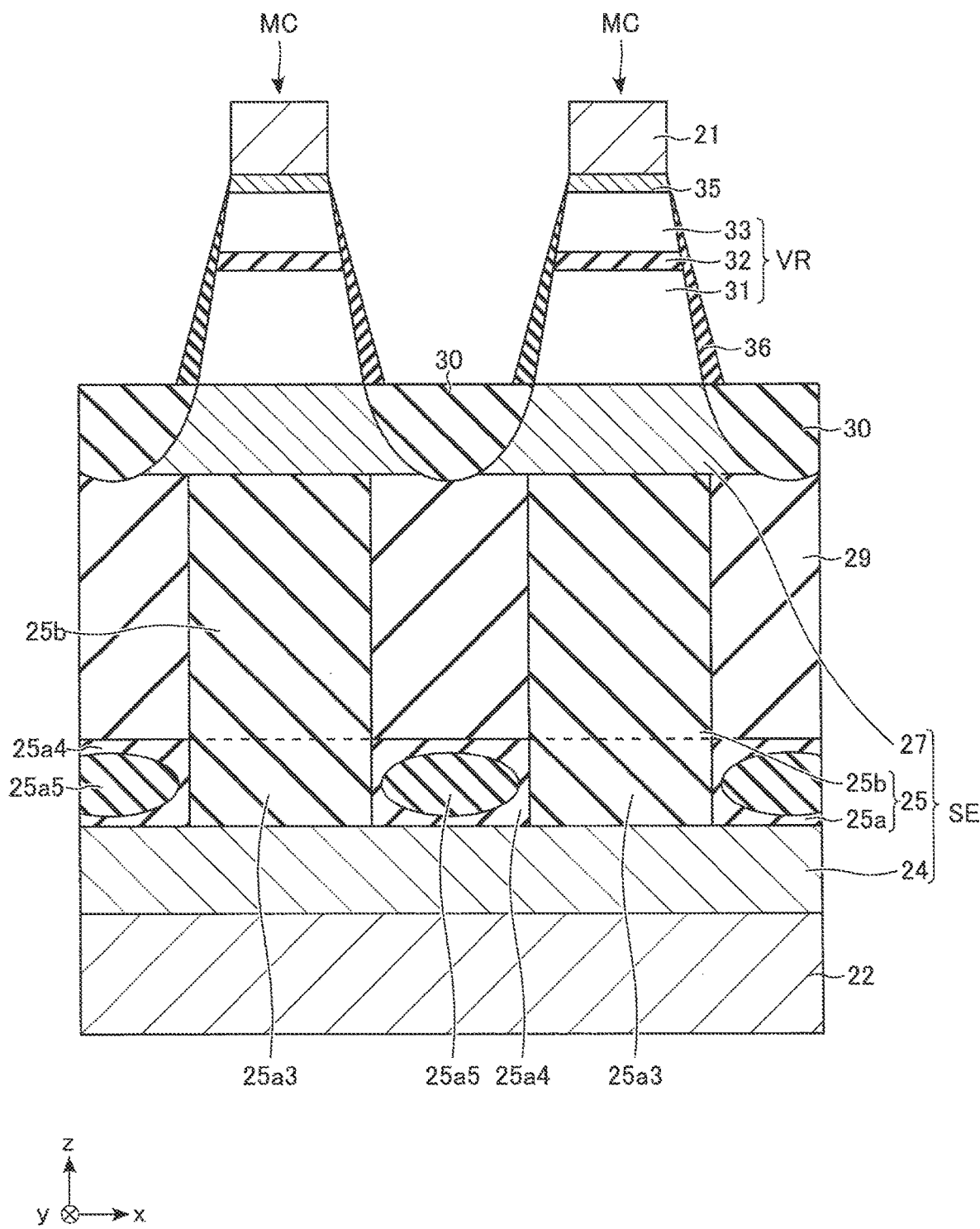
FIG. 5 shows a cross section of at exemplary structure of memory cells according to the first embodiment.
Figure 6:
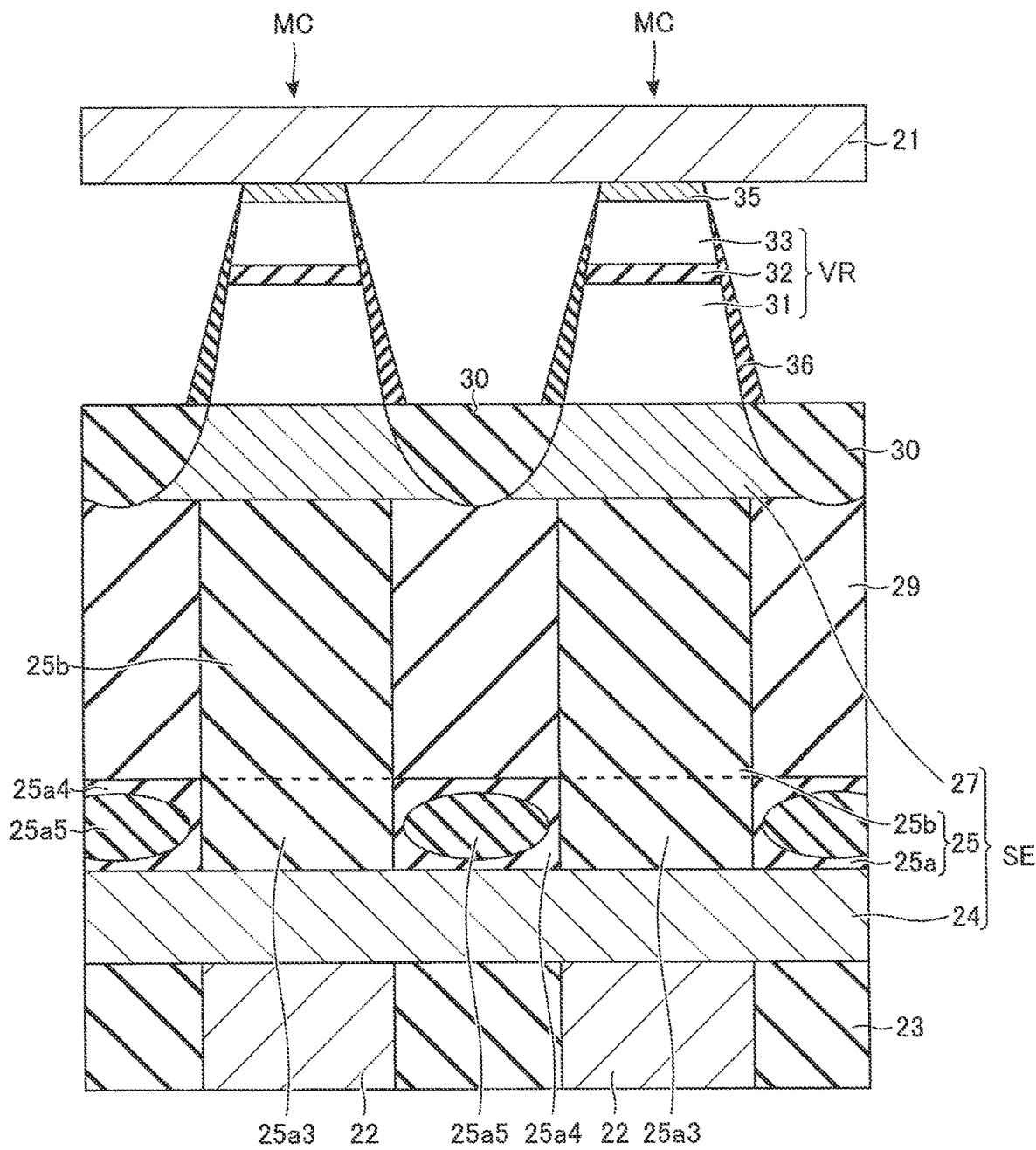
FIG. 6 shows another cross section of the exemplary structure of memory cells according to the first embodiment.

FIGS. 5 and 6 show cross sections of an exemplary structure of memory cells according to the first embodiment. FIG. 5 shows a cross section along the xz plane, and FIG. 6 shows a cross section along the yz plane. FIGS. 5 and 6 show a structure from a layer at which a conductor 22 is located to the layer immediately above on which a conductor 21 is located along the z-axis. In other words, the memory cells MC shown in FIGS. 5 and 6 correspond to memory cells MCa.

As shown in FIGS. 5 and 6, a conductor 22 is provided within the interlayer insulator 23. On the upper surface of each conductor 22, memory cells MC are located. Each memory cell MC includes a switching element SE, a magnetoresistance effect element VR on the switching element SE, a side-wall insulator 36, and a hardmask 35. The memory cell MC may include additional layers.

Each switching element SE is located on the upper surface of a single conductor 22. The switching element SE includes at least a variable resistance material (layer) 25. The switching element SE can include a lower electrode 24 and an upper electrode 27 in addition to the above-mentioned components. In this case, the lower electrode 24 is located on the upper surface of the conductor 22, the variable resistance material 25 is located on the upper surface of the lower electrode 24, and the upper electrode 27 is located on the upper surface of the variable resistance material 25. The descriptions hereinafter are based on an example where the switching element SE includes a lower electrode 24 and an upper electrode 27.

Each lower electrode 24 is realized by part of a single conductor. That is, a conductor that functions as a of lower electrodes 24 is located on the upper surface of the conductor 22 and the interlayer insulator 23, and extends across the xy plane. Hereinafter, the conductor including the parts that function as the lower electrodes 24 and extending across the xy plane may be referred to as a lower electrode 24. The lower electrode 24 either includes, or is made of, titanium nitride (TiN).

Each variable resistance material 25 is realized by part of a single insulator. That is, the variable resistance material 25 that functions as a set of variable resistance materials 25 is located on the upper surface of the lower electrode 24, and extends across the xy plane. The variable resistance material 25 is, for example, a switching element between two terminals, and the first terminal corresponds to one of the upper or lower surfaces of the variable resistance material 25, and the second terminal corresponds to the other. The variable resistance material 25 is made of a material constituted by an insulator and contains a dopant introduced by ion implantation. The insulator includes a nitride and/or an oxide, for example a silicon nitride (SiN), a hafnium oxide (HfOx), and/or $SiO_2$ or a material substantially made of $SiO_2$. The dopant contains, for example, arsenic (As) and germanium (Ge).

The variable resistance material 25 consists of a single first part 25a and a plurality of second parts 25b. The first part 25a makes up the lower portion of the variable resistance material 25 including the lower surface thereof, and expands on the upper surface of the lower electrode 24 over the xy plane. Each second part 25b makes up the upper portion of the variable resistance material 25 including the upper surface thereof, and is located at an area where each conductor 22 intersects one of the plurality of conductors 21 on the xy plane. The second part 25b is independent from another, and its lower surface is coupled to the upper surface of the first part 25a.

The first part 25a of the variable resistance material 25 consists of a third part 25a3, a fourth part 25a4, and a fifth part 25a5. Each third part 25a3 makes up the portion immediately under a single second part 25b. Each fourth part 25a4 makes up the portion between adjacent third parts 25a3. Each fifth part 25a5 is located inside a single fourth part 25a4 and makes up a large area which includes the center of the fourth part 25a4. In other words, the fourth part 25a4 makes up a surface part of the area consisting of the fourth part 25a4 and the fifth part 25a5.

A dopant concentration is similar among the second parts 25b of the variable resistance material 25. Specifically, each second part 25b has a unique concentration profile of a dopant when viewed on a microscopic scale; however, since the second part 25b has a hyperfine structure, it is possible to assume that all the second parts 25b have, comparable dopant concentrations when viewed on a macroscopic scale. Such a dopant concentration of a certain component which can be deemed similar across the entire component will be referred to as an "average dopant concentration". For example, it may be possible that an average dopant concentration of a certain second part 25b is a ratio of an amount of a dopant contained in this second part 25b to a volume of this second part 25b.

Furthermore, different second parts 25b may have different dopant concentration profiles and/or different average dopant concentrations. However, as described later, since the second parts 25b are formed in the same process, they may have substantially the same average dopant concentration. Herein, the expression "substantially" should be construed to mean that characteristics modified by the expression can tolerate variations in values due to unintended variations in a process.

Of the entire variable resistance material 25, a set of a second part 25b and a third part 25a3 that, is immediately under the second part 25b functions as a single switching element SE. The manifestation of functions and the characteristics of the switching element SE is dependent on the average dopant concentrations of the second part 25b and the third part 25a3. The average dopant concentration of each of the second part 25b and the third part 25a3 has a value that allows a stitching element SE realized by a set of the second part 25b and the third part 25a3 to have the demanded characteristics. The average dopant concentration of each of the second part 25b and the third part 25a3 may be substantially the same or differ from each other, as long as the concentration is in a value that allows a switching element SE to have the demanded characteristics. However, for the sake of brevity, the descriptions hereinafter will be based on a case where the average dopant concentration of the second part 25b and that of the third part 25a3 are substantially same.

On the other hand, the fourth parts 25a4 and the fifth parts 25a5 of the variable resistance material 25 have only a negligible effect on the characteristics of the switching elements SS. For this reason, the average dopant concentration of each of the fourth part 25a4 and the fifth part 25a5 has a value irrelevant to the characteristics demanded for the switching elements SE, and is greatly lower than the average dopant concentration of either the second part 25b or the third part 25a3. The average dopant concentration of each of the second parts 25b and the third parts 25a3 differs from the average dopant concentration of the fifth parts 25a5. For example, the fifth parts 25a5 contains almost no dopant.

The area between the second parts 25b of the variable resistance material 25 is provided with an insulator 29 and is filled by the insulator 29, for example. The insulator 29 either contains, or is made of, for example, a silicon oxide.

Each upper electrode 27 is positioned on the upper surface of the second part 25b of the variable resistance material 25 of a switching element SE in which the upper electrode 27 is included. The upper electrode 27 is independent from another. The upper electrode 27 either includes, or is made of, TiN, for example. Each upper electrode 27 is, for example, tapered on its side surface, and its upper surface area size along the xy plane is smaller than that of the lower surface along the xy plane.

The area between the upper electrodes 27 is provided with an insulator 30 and, for example, is filled by the insulator 30. The insulator 30 either contains or is made of, for example, a silicon oxide.

A single magnetoresistance effect element VR is located on the upper surface of each upper electrode 27. Each magnetoresistance effect element VR is, for example, tapered on its side surface, and for example its upper surface area size along the xy plane is smaller than that of the lower surface along the xy plane. For example, the side surface of each magnetoresistance effect element VR is located on a line extended to the side surface of the upper electrode 27 positioned below the magnetoresistance effect element VR.

In the present embodiment and a modification to be described later, a case where the magnetoresistance effect element VR is a magnetic tunnel junction (MTJ) element having an MTJ will be described. Specifically, the magnetoresistance effect element VR includes a ferromagnetic layer 31, an insulating layer 32, and a ferromagnetic layer 33. In one example, as shown in FIGS. 5 and 6, the insulating layer 32 is on the upper surface of the ferromagnetic layer 31, and the ferromagnetic layer 33 is on the upper surface of the insulating layer 32.

The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of the ferromagnetic layer 31 is intended to remain unchanged even when data is read or written in the magnetoresistance memory device 1. The ferromagnetic layer 31 can function as a so-called "reference layer". The ferromagnetic layer 31 may include a plurality of layers. The insulating layer 32 contains or is made of, for example, magnesium oxide (MgO), and functions as a so-called "tunnel barrier".

The ferromagnetic layer 33 either contains or is made of, for example, cobalt iron boron (CoFeB) or iron boride (FeB). The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 can function as a so-called "storage layer".

When the magnetization direction of the ferromagnetic layer 33 is parallel to the magnetization direction of the ferromagnetic layer 31, magnetoresistance effect element VR is in a state of having low resistance. When the magnetization direction of the ferromagnetic layer 33 is anti-parallel to the magnetization direction of the ferromagnetic layer 31, the magnetoresistance effect element VR is in a state of having a resistance higher than that in the case where the magnetization directions of the ferromagnetic layers 31 and 33 are anti-parallel to each other.

When a certain magnitude of write current flows from the ferromagnetic layer 33 to the ferromagnetic layer 31, the magnetization direction of the ferromagnetic layer 33 becomes parallel to the magnetization direction of the ferromagnetic layer 31. In contrast, when another magnitude or write current flows from the ferromagnetic layer 31 to the ferromagnetic layer 33, the magnetization direction of the ferromagnetic layer 33 becomes anti-parallel to the magnetization direction of the ferromagnetic layer 31.

The hardmask 35 is located on the upper surface of the magnetoresistance effect element VR, for example the upper surface of the ferromagnetic layer 33. The hardmask 35 is made of a conductor, and includes, or is made of, TiN, for example.

The side surface of the magnetoresistance effect element VR and that of the hardmask 35 are covered by a side-wall insulator 36. The side-wall insulator 36 either includes or is made of, for example, a silicon nitride.

A conductor 21 is provided on the upper surface of the hard mask 35 of each of the memory cells MC arranged along the y-axis.

1.2. Manufacturing Method

FIGS. 7 to 13 sequentially show structures of part of the magnetoresistance memory device of the first embodiment in a manufacturing process. FIGS. 7 to 13 show the same cross section as that shown in FIG. 5.

Figure 7:
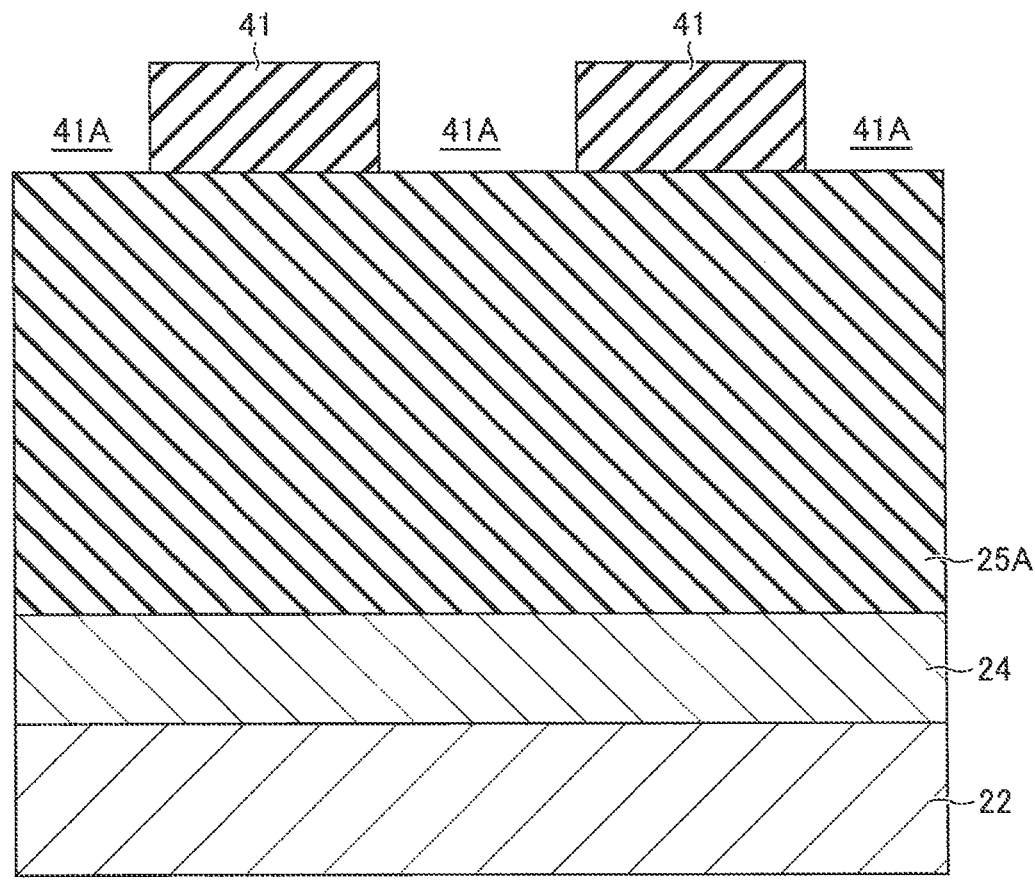
FIG. 7 shows a structure of part of the magnetoresistance memory device of the first embodiment at a point in time in a manufacturing process.

As shown in FIG. 7, a plurality of conductors 22 are formed within the interlayer insulator 23 (not shown). Subsequently, on the upper surface of the interlayer insulator 23 and the upper surface of the conductor 22, the lower electrode 24A and the variable resistance material 25A are deposited in this order. Examples of the deposition method include chemical vapor deposition (CVD) and sputtering. Each of the lower electrode 24A and the variable resistance material 25A are components slated to be processed into a lower electrode 24 and a variable resistance material 25 in a later stage. The variable resistance material 25A either includes or is made of a silicon oxide.

A hardmask 41 is formed on the upper surface of the variable resistance material 25A. The hardmask 41 remains in the areas immediately above that in which the second parts 25b of the variable resistance material 25 are slated to be formed, and has openings 41A in the remaining areas. Each opening 41A spans the upper surface to the lower surface of the hardmask 41. The hardmask 41 is made of an insulator.

Figure 8:
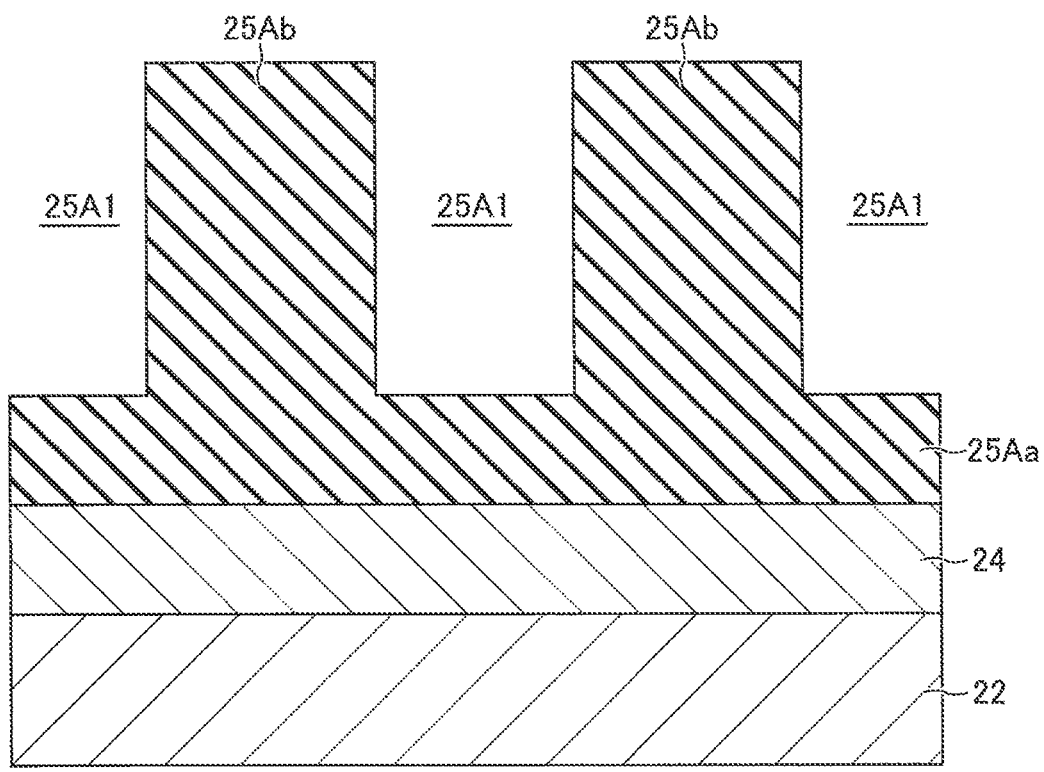
FIG. 8 shows a structure at a point in time subsequent to that shown in FIG. 7.
Figure 8:
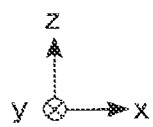

As shown in FIG. 8, the variable resistance material 25A is partially removed by isotropic etching, using the hardmask 41 as a mask, and openings 25A1 are thereby formed. Examples of the isotropic etching includes reactive ion etching (RIE). The etching is stopped before the lower surface of the variable resistance material 25A is formed. In other words, the first part 25Aa in the lower part including the lower surface of the variable resistance material 25A is left over, and the opening 25A1 does not reach the lower surface of the variable resistance material 25A. The first part 25Aa corresponds to a part slated to be processed into a first part 25a of the variable resistance material 25 in a later stage. On the other hand, by partially removing the upper portion of the variable resistance material 25A by etching, a plurality of second parts 25Ab of the variable resistance material 25A are formed. The second parts 25Ab correspond to the portion slated to be processed into the second parts 25b of the variable resistance material 25 in a later stage. The hardmask 41 is also cut away by the etching.

Figure 9:
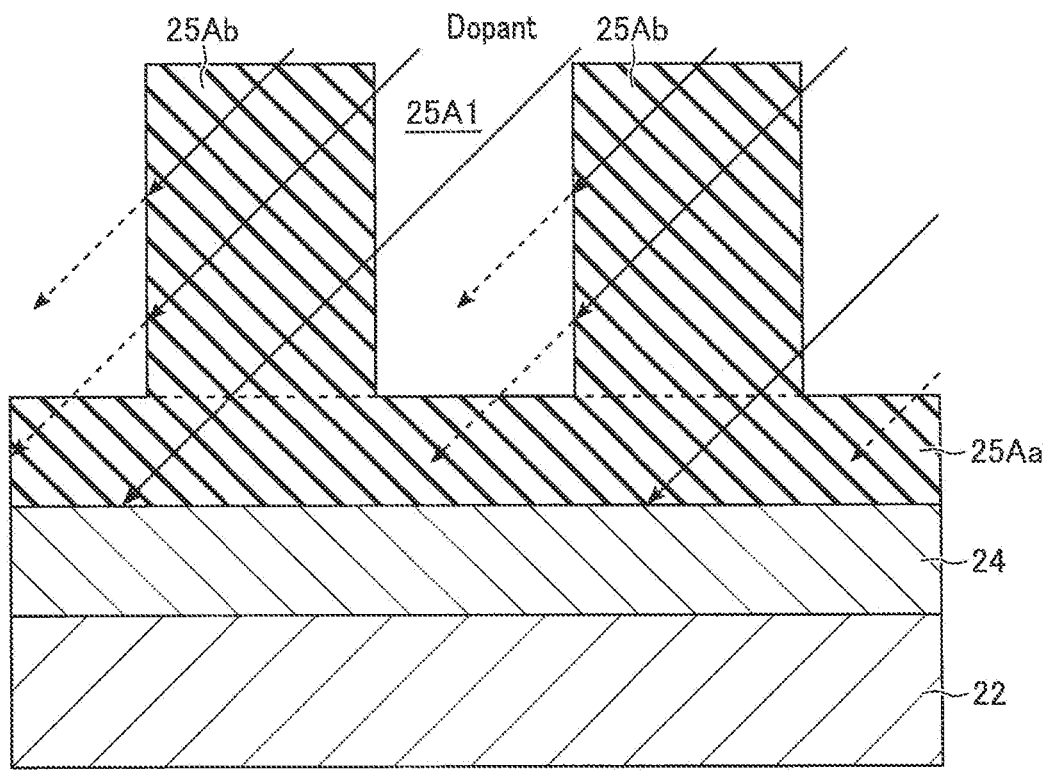
FIG. 9 shows a structure at a point in time subsequent to that shown in FIG. 8.

As shown in FIG. 9, a dopant is introduced by ion implantation into the structure obtained through the manufacturing steps so far. The dopant is a dopant included in the variable resistance material 25. The trajectory of the dopant has an angle with respect to the z axis. Part of the dopant that advances in such a trajectory is indicated by the solid-line arrows, and enters the variable resistance material 25A from the upper surfaces of the second parts 25Ab and from the side surfaces of the second parts 25Ab via the openings 25A1. The ion implantation is performed using energy that allows the dopant entering from the upper and side surfaces of the second parts 25Ab to cease moving and remain within the variable resistance material 25A. In other words, energy of the dopant that has entered the variable resistance material 25A is gradually attenuated by the act of the atoms of the variable resistance material 25A. As a result of the energy attenuation, the majority of the dopant having entered the variable resistance material 25A remains within the variable resistance material 25A.

The ion implantation is performed, with a targeted structure being rotated around the z-axis. FIG. 9 shows only a single state during the rotation. The dopant is implanted into areas not located on a line extended from the solid-line arrows in FIG. 9.

On the other hand, the adjustment of energy used in the ion implantation and the deceleration in the variable resistance material 25A inhibit the dopant having entered from the side surfaces of the second parts 25Ab of the variable resistance material 25A from passing through the second parts 25Ab and reaching the openings 25A1. Or, even if part of the dopant having entered from the side surfaces of the second parts 25Ab passes through the second parts 25Ab and reaches the openings 25A1, only a small amount of energy is left in the dopant. For this reason, as indicated by the dotted line, the dopant is greatly inhibited from reaching the lower portions of the openings 25A1 in the variable resistance material 25A.

Figure 10:
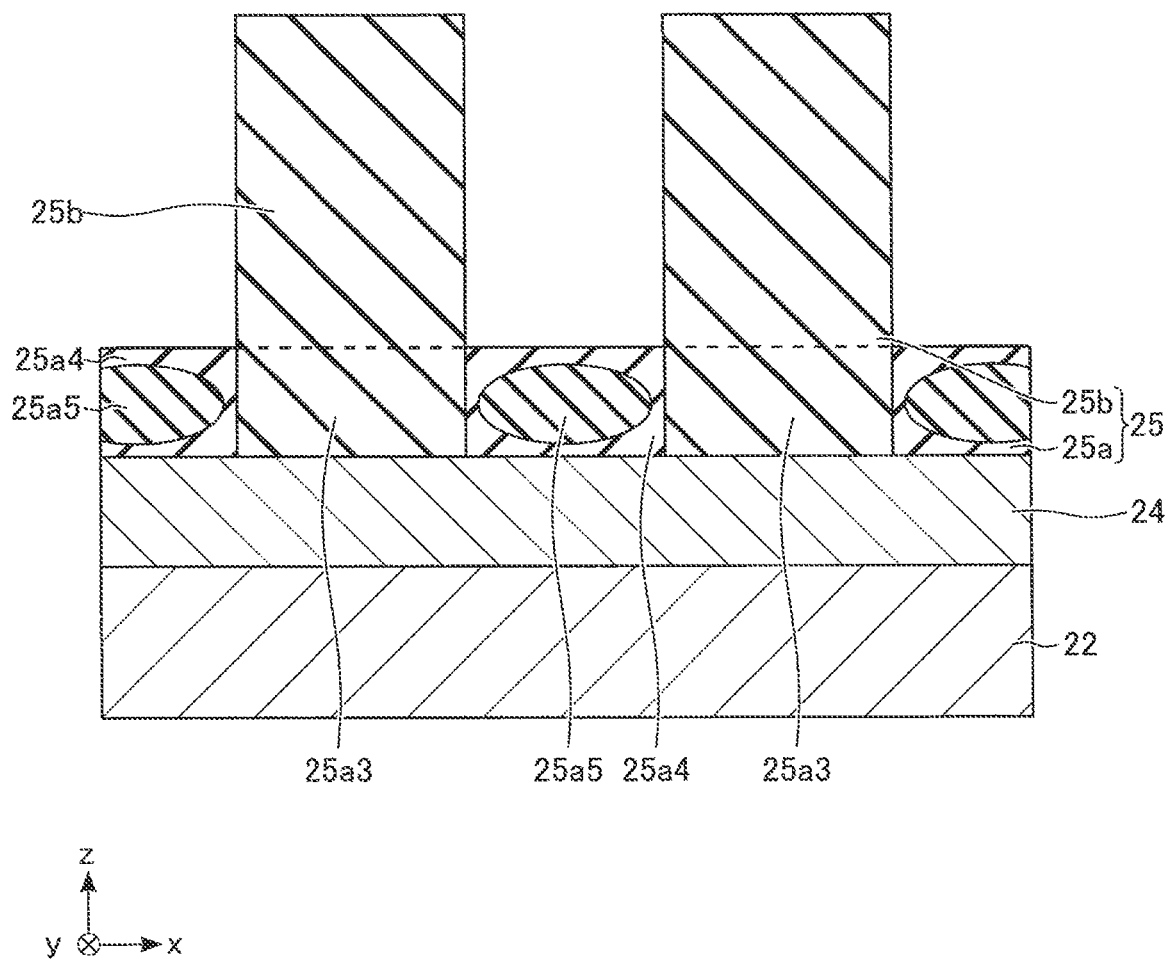
FIG. 10 shows a structure at a point in time subsequent to that shown in FIG. 9.

As shown in FIG. 10, as a result of the dopant implantation, the variable resistance material 25A is formed into a variable resistance material 25. In other words, the areas in which the majority of the dopant remains in the variable resistance material 25A are formed into the second parts 25b and the third parts 25a3 of the variable resistance material 25. On the other hand, in the variable resistance material 25A, the areas into which almost no dopant has been introduced become the fifth parts 25a5 of the variable resistance material 25. The fifth parts 25a5 contain almost no dopant, for example. A small amount of a dopant may be introduced into a surface layer of each area between adjacent third parts 25a3 in the variable resistance material 25. As a result, fourth parts 25a4 are formed. Compared to the second parts 25b and the third parts 25a3, a minimal amount of the dopant is introduced into the fourth parts 25a4; therefore, the fourth parts 25a4 have an average dopant concentration far lower than that of each of the second part 25b and the third part 25a3.

Figure 11:
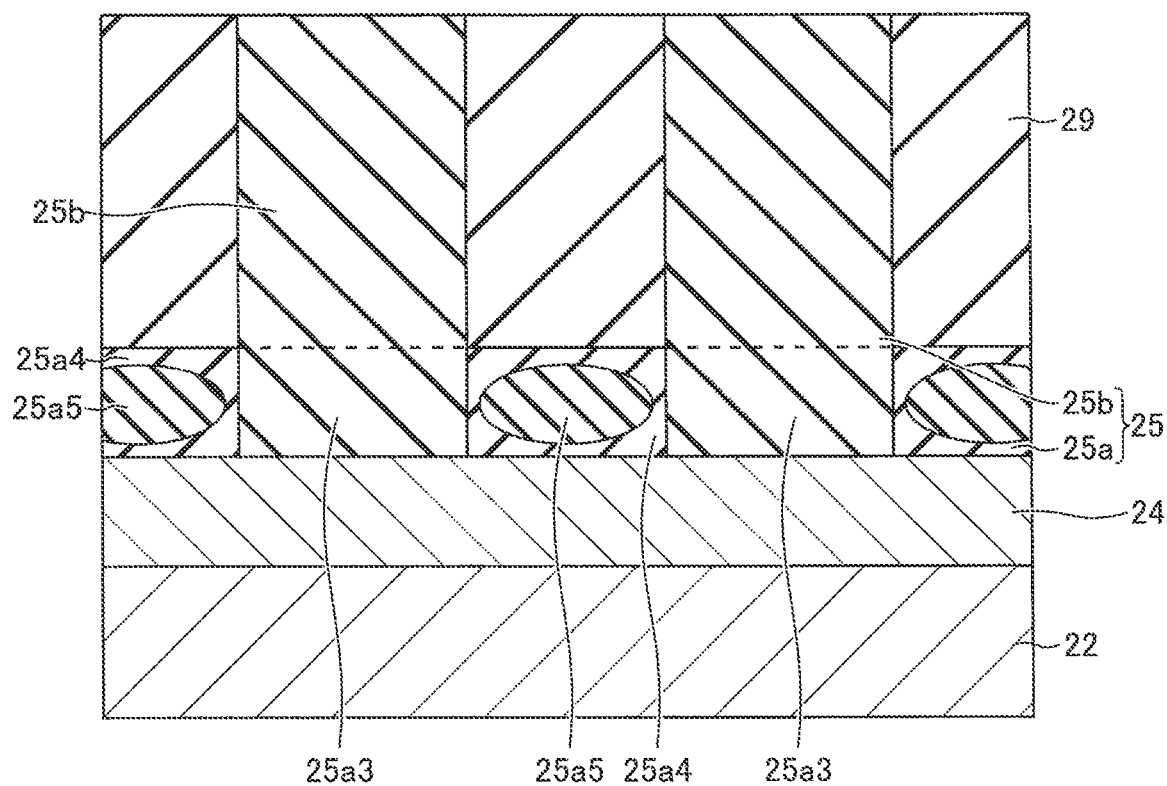
FIG. 11 shows a structure at a point in time subsequent to that shown in FIG. 10.

As shown in FIG. 11, an insulator 29 is formed. In other words, an insulator 29A is deposited on the upper surface of the structure obtained through the manufacturing steps so far. Examples of the deposition method include CVD and sputtering. The insulator 29A fills the area between the second parts 25b of the variable resistance material 25. Subsequently, an insulator 29 is formed by removing the insulator 29A on the upper surface of the second part 25b.

Figure 12:
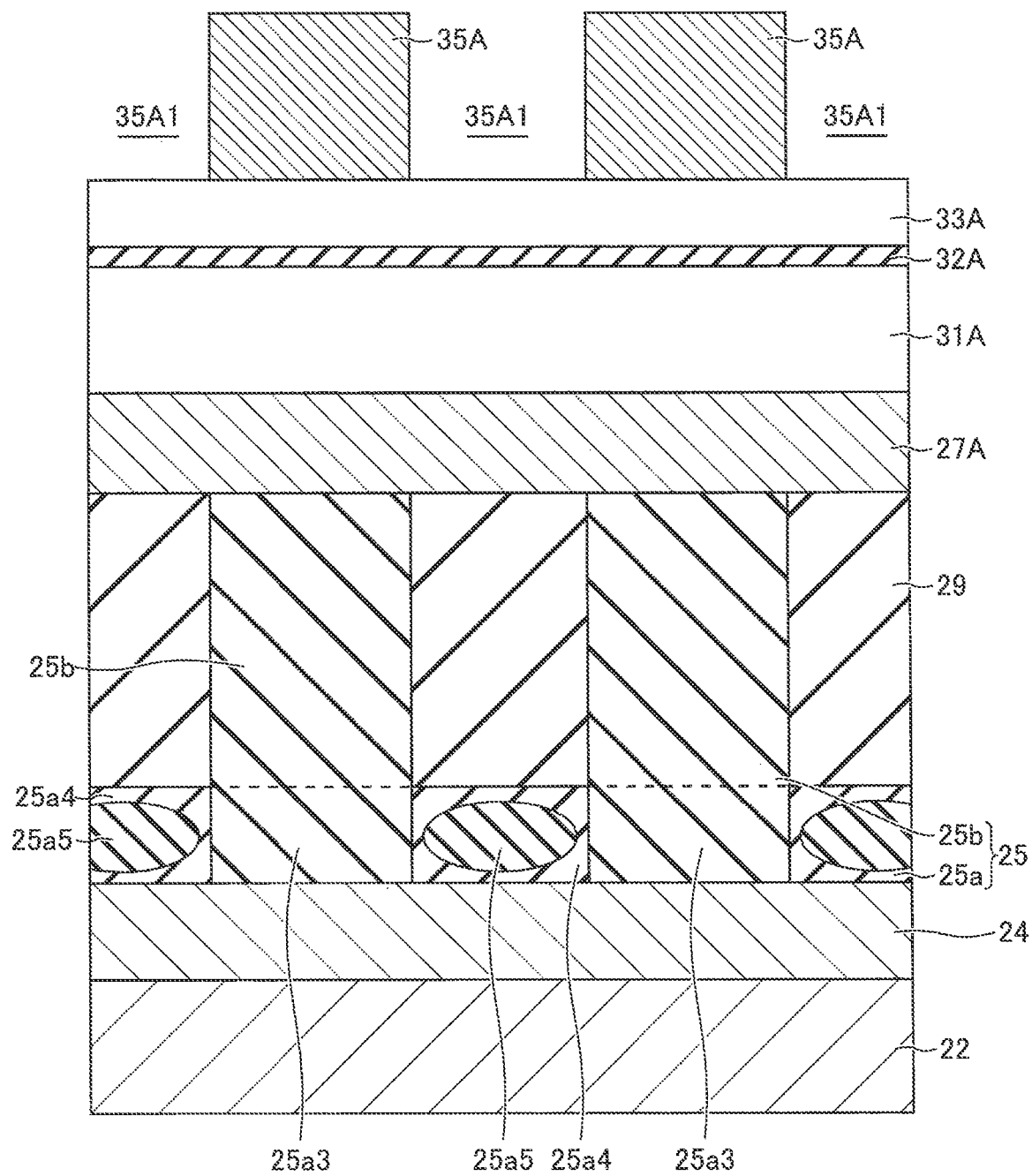
FIG. 12 shows a structure at a point in time subsequent to that shown in FIG. 11.

As shown in FIG. 12, an upper electrode 27A, a ferromagnetic layer 31A, an insulating layer 22A, a ferromagnetic layer 33A, and a hardmask 35A are deposited in this order on the upper surfaces of the second parts 25b of the variable resistance material 25 and the upper surface of the insulator 29. Examples of the deposition method include CVD and sputtering. The hardmask 35A remains immediately above the areas in which the magnetoresistance effect elements VR are slated to be formed, and has openings 35A1 in the remaining areas. Each opening 35A1 spans the upper surface to the lower surface of the hardmask 35A.

Figure 13:
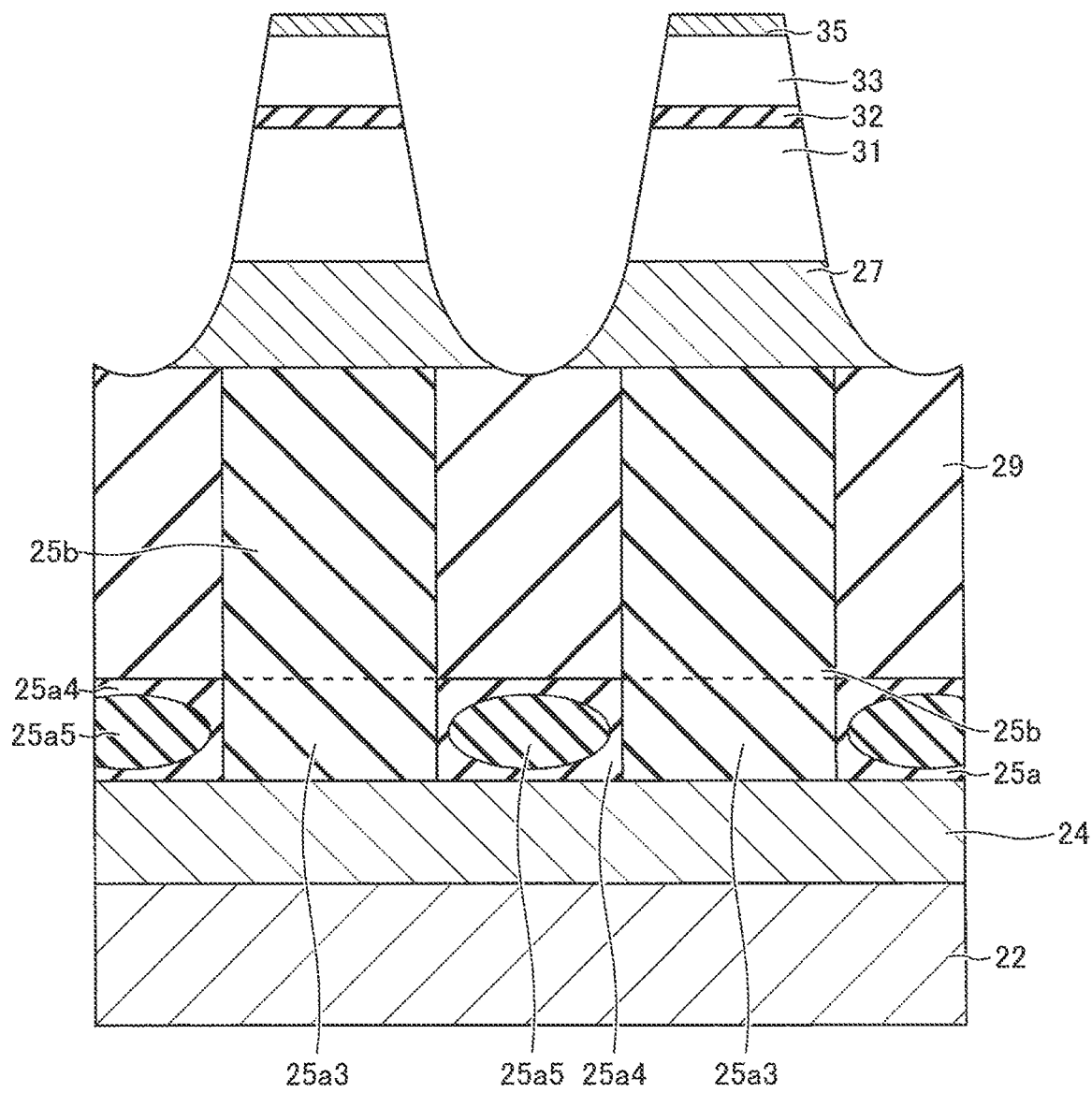
FIG. 13 shows a structure at a point in time subsequent to that shown in FIG. 12.

As shown in FIG. 13, the structure obtained through the manufacturing steps so far is etched by ion beam etching (IBE). The ion beam has an angle with respect to the z-axis. Such an ion beam enters the openings 35A1 of the hardmask 35A and partially removes the exposed components in the openings 35A1. Part of the ion beam is blocked by the hardmask 35A, and cannot reach deeper areas of the openings 35A1. However, the hardmask 35A is also partially removed by the IBE, and the upper surface level of the hardmask 35A gradually becomes lower as the IBE progresses. As a result, the ion beam can reach deeper areas in the openings 35A1 as the IBE progresses. For this reason, as the IBE progresses, the ferromagnetic layer 31A, the insulating layer 32A, the ferromagnetic layer 33A, and the upper electrode 27A are etched in their parts inside the openings 35A1. As a result of the etching, the ferromagnetic layer 31A, the insulating layer 32A, the ferromagnetic layer 33A, and the upper electrode 27A are divided into multiple parts and thereby formed into ferromagnetic layers 31, insulating layers 32, ferromagnetic layers 33, and upper electrodes 27.

As shown in FIG. 1, an insulator 30, a side-wall insulator 36, and a conductor 21 are formed.

1.3. Advantages (Advantageous Effects)

According to the first embodiment, it possible to provide a magnetoresistance memory device 1 including switching elements SE with fewer variations in characteristics, as will be described below.

Figure 14:
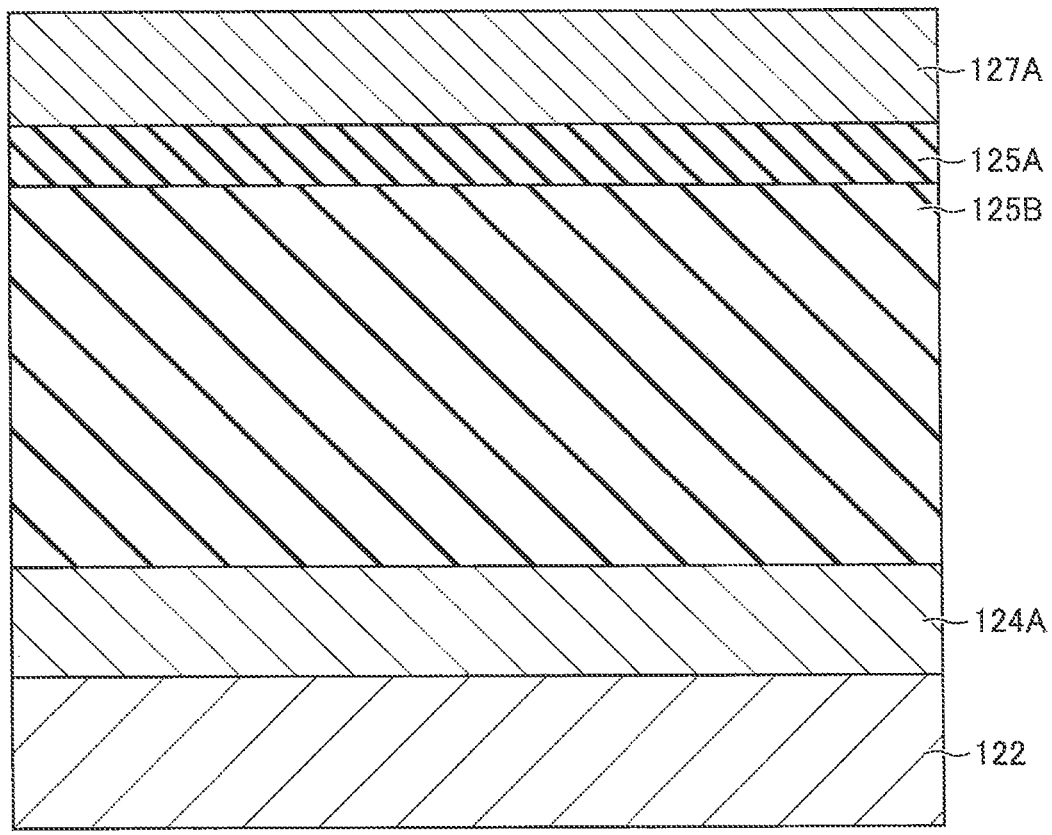
FIG. 14 shows a state of a reference magnetoresistance memory device in a manufacturing process.
Figure 15:
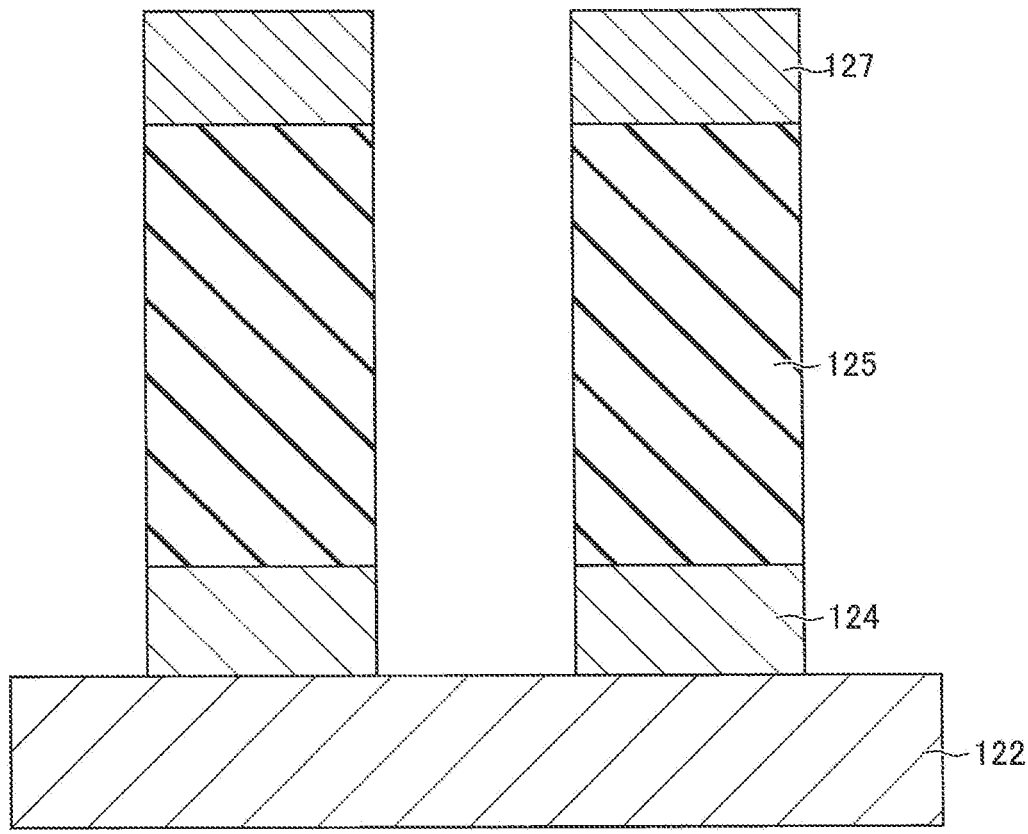
FIG. 15 shows a structure at a point in time subsequent to that shown in FIG. 14.
Figure 15:
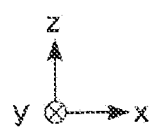

A switching element capable of bidirectional operation and formed by introducing a dopant, such as the switching element SE can be formed by a method described below. FIGS. 14 and 15 each show a state in a reference process of manufacturing a magnetoresistance memory device 1, and a structure corresponding to the part of the magnetoresistance memory device shown in FIG. 5.

As shown in FIG. 14, similarly to FIG. 7 of the first embodiment, the lower electrode 124A and the variable resistance material 125A are deposited in this order on the upper surface of the interlayer insulator 123 (not shown) and the upper surface of the conductor 122. Each of the lower electrode 124A and the variable resistance material 125A are components slated to be processed into a lower electrode 124 and a variable resistance material 125 in the later stage. The lower electrode 124 and the variable resistance material 125 are intended to have the same functions as those of the lower electrode 24 and the variable resistance material 25 of the first embodiment.

Dopant is introduced into the variable resistance material 125A by ion implantation, and a variable resistance material 125B is thereby formed. The upper electrode 127A is formed on the upper surface of the variable resistance material 125A. The upper electrode 127A is a component slated to be processed into an upper electrode 127 in later stage. The upper electrode 127 is intended to have the same functions as those of the upper electrode 27 of the first embodiment.

As shown in FIG. 15, the lower electrode 124A, the variable resistance material 125A, and the upper electrode 127A are partially removed by RIE. By this etching, the lower electrode 124A, the variable resistance material 125A, and the upper electrode 127A are formed into multiple sets of the lower electrode 124, the variable resistance material 125, and the upper electrode 127.

Observations have found out that characteristics, particularly resistance values, of the thereby obtained variable resistance material 125 vary. It has been understood that one reason for such variations is the reduction in a dopant concentration due to the RIE. Specifically, RIE may damage a surface of an element subjected RIE, and the side surface of the variable resistance material 125 may be greatly damaged by RIE. This damage may degrade the characteristics of the variable resistance material 125. It is assumed that the reason is loss and/or decrease of a dopant in damaged areas. The dopant concentration affects an amount of current flowing in the damaged area. For this reason, because of the damages by RIE in an area including the side surface of the variable resistance material 125, an amount of current flowing in this area is small. How damage is caused and an extent of a dopant concentration decrease may differ between variable resistance materials 125. It is assumed that the characteristics of the variable resistance material 125 vary for such a reason.

According to the first embodiment, the variable resistance material 25A is formed into a plurality of variable resistance materials 25 through RIE in advance of dopant introduction, and the dopant is thereafter introduced into the variable resistance material 25. Thus, decrease of a dopant concentration in the side surface of the variable resistance material 25 due to RIE is thereby suppressed. For this reason, it is possible to provide a magnetoresistance memory device 1 including switching elements SE with fewer variations in characteristics.

1.4. Modifications

Figure 16:
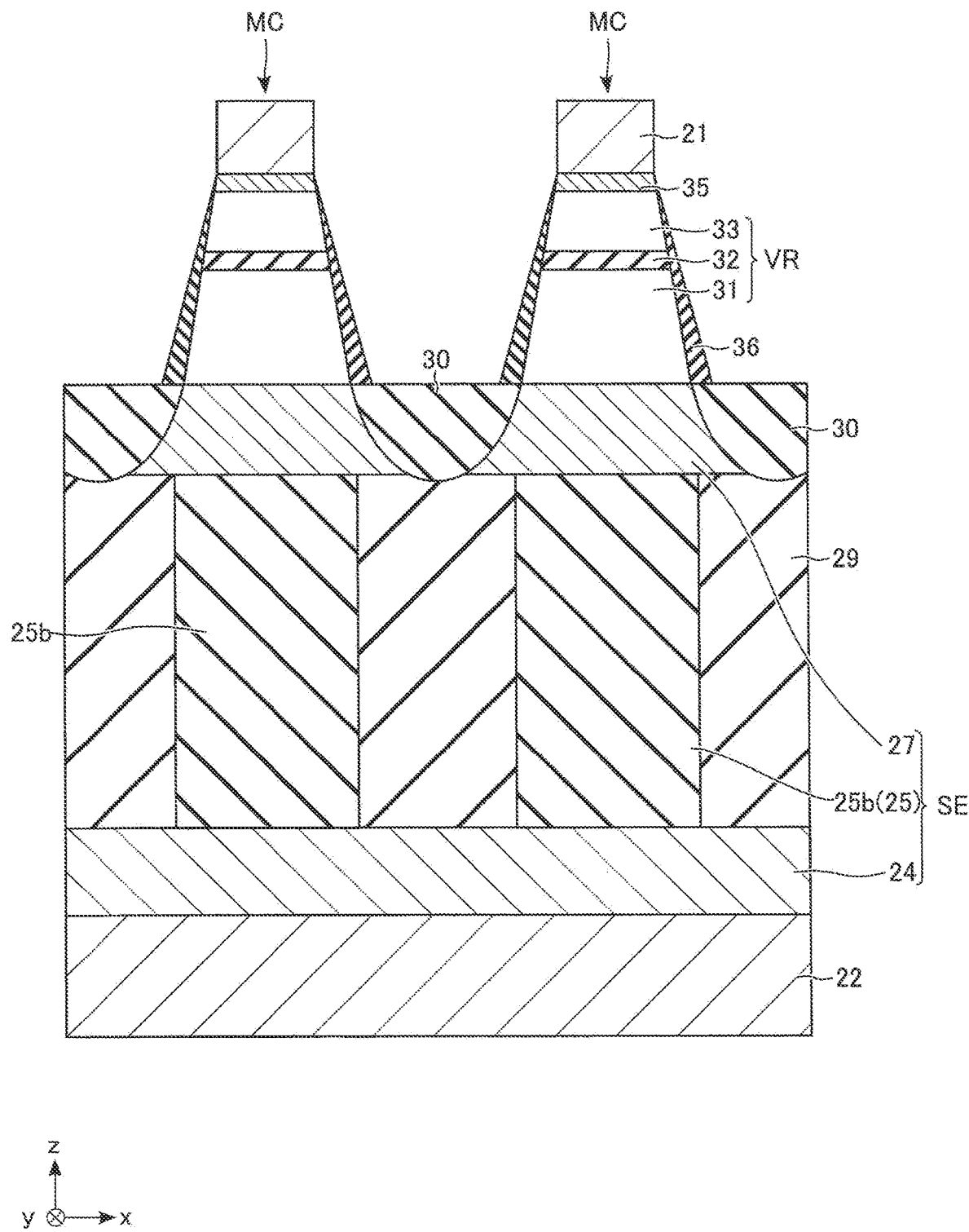
FIG. 16 shows a cross section of an exemplary structure of a magnetoresistance memory device of a modification of the first embodiment.

Each variable resistance material 25 of a plurality of memory cells MC may be independent from one another. FIG. 16 shows such an example, showing the same part shown in FIG. 5 in a cross section of a reference structure of a magnetoresistance memory device of a modification of the first embodiment.

As shown in FIG. 16, the variable resistance material 25 does not include the first part 25a. In other words, each switching element SE includes a single independent second part 25b of the variable resistance material 25. The second parts 25b are located on the upper surface of the lower electrode 24.

The structure shown in FIG. 16 can be formed when the RIE in the step shown in FIG. 8 continues from the step described with reference to FIG. 8.

According to the modification, it is possible to achieve the same advantages effects as those achieved by the first embodiment.

2. Second Embodiment

The second embodiment differs from the first embodiment in the structure of the variable resistance material. The rest of the second embodiment is the same as the first embodiment. Of the configuration of the second embodiment, part differing from that of the first embodiment will be described below.

2.1. Structure

Figure 18:
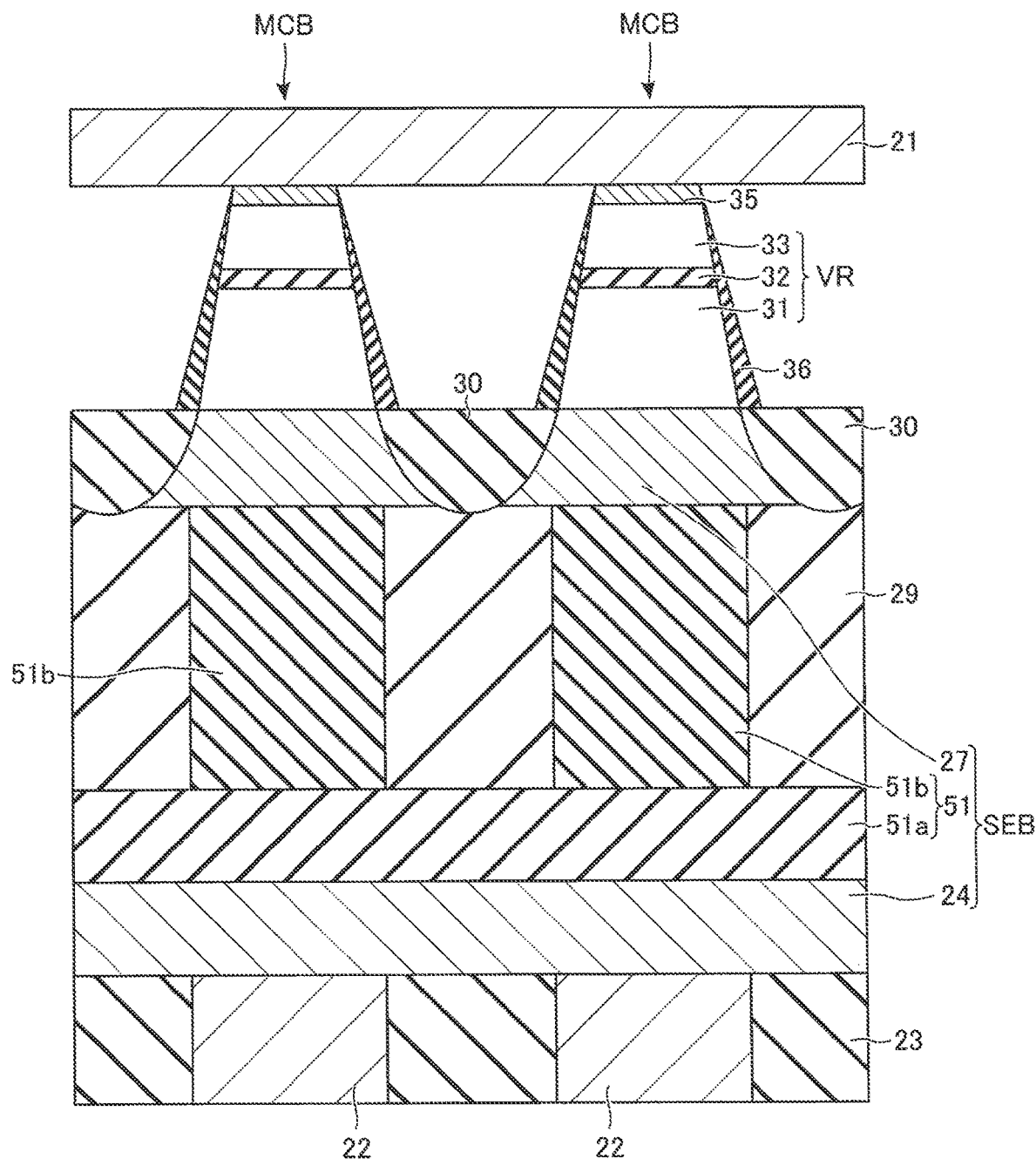
FIG. 18 shows another cross section of the exemplary structure of memory cells according to the second embodiment.

FIGS. 17 and 18 show cross sections of an exemplary structure of memory cells according to the second embodiment. FIG. 17 shows a cross section along the xz plane, and FIG. 18 shows a cross section along the yz plane. To distinguish from the memory cell MC and the switching element SE of the first embodiment, the memory cell MC and the switching element SE according to the second embodiment may be referred to as a "memory cell MCB" and a "switching element SEB", respectively. Each memory cell MCB includes a switching element SEB instead of the switching element SE of the first embodiment, and the switching element SEB includes a variable resistance material 51 instead of the variable resistance material 25 of the first embodiment.

As shown in FIGS. 17 and 18, the variable resistance material 51 is positioned on the upper surface of the lower electrode 24.

The variable resistance material 51 consists of a single first part 51a and a plurality of second parts 51b. The first part 51a makes up the lower portion of the variable resistance material 51 including the lower surface, and expands on the upper surface of the lower electrode 24 across the xy plane.

Each second part 51b makes up the upper portion of the variable resistance material 51 including the upper surface thereof. The second part 51b is independent from another, and its lower surface is connected to the upper surface of the first part 51a. The length of the second part 51b on the x axis, or the width of the second part 51b, is smaller than that of at least the lower surface of the magnetoresistance effect element VR on the x axis.

The second part 51b extends along the y axis. Each memory cell MCB includes a switching element SEB, and each switching element SEB includes a plurality of second parts 51b. FIG. 17 shows an example in which each memory cell MCB includes four second parts 51b. In each memory cell MCB, the second parts 51b are arranged along the x axis at intervals.

All second parts 51b of the variable resistance material 51 have substantially the same average dopant concentration. The second parts 51b have an average dopant concentration higher than that of the first parts 51a. For example, the average dopant concentration of the second parts 51b and that of the first parts 51a are different.

The area between the second parts 51b of the variable resistance material 51 is provided with an insulator 29.

2.2. Manufacturing Method

FIGS. 19 to 23 sequentially show structures of part of the magnetoresistance memory device of the first embodiment in a manufacturing process. FIGS. 19 to 23 show the same cross section as that shown in FIG. 17.

Figure 19:
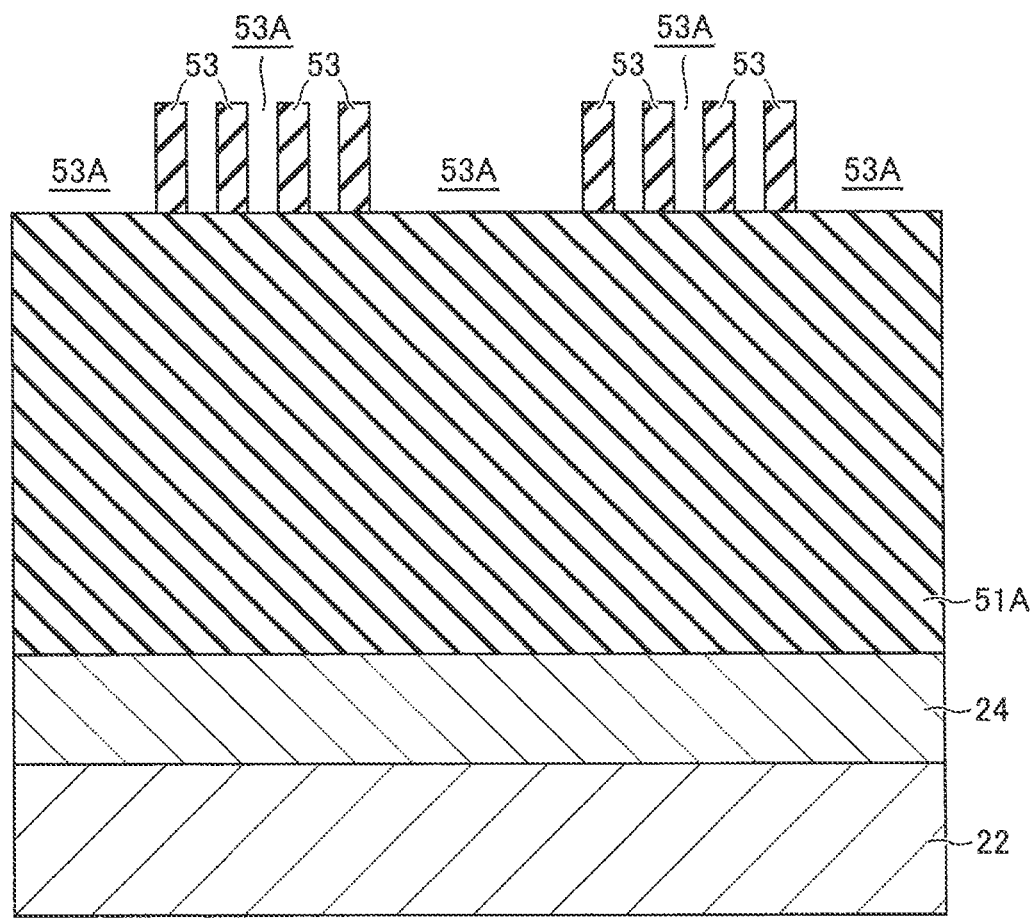
FIG. 19 shows a structure of part of the magnetoresistance memory device of the second embodiment at a point in time in a manufacturing process.

As shown in FIG. 19, the conductor 22 and the lower electrode 24A are formed through the same process as that shown in FIG. 7 of the first embodiment; subsequently, the variable resistance material 51A is deposited on the upper surface of the lower electrode 24A. The variable resistance material 51A is a component slated to be processed into the variable resistance material 51, and either includes or is made of a silicon oxide.

A hardmask 53 is formed on the upper surface of the variable resistance material 51A. The hardmask 53 remains in the areas immediately above that in which the second parts 51b of the variable resistance material 51 are slated to be formed, and has openings 53A in the remaining areas. Each opening 53A spans the upper surface to the lower surface of the hardmask 53. The hardmask 53 is made of an insulator.

Figure 20:
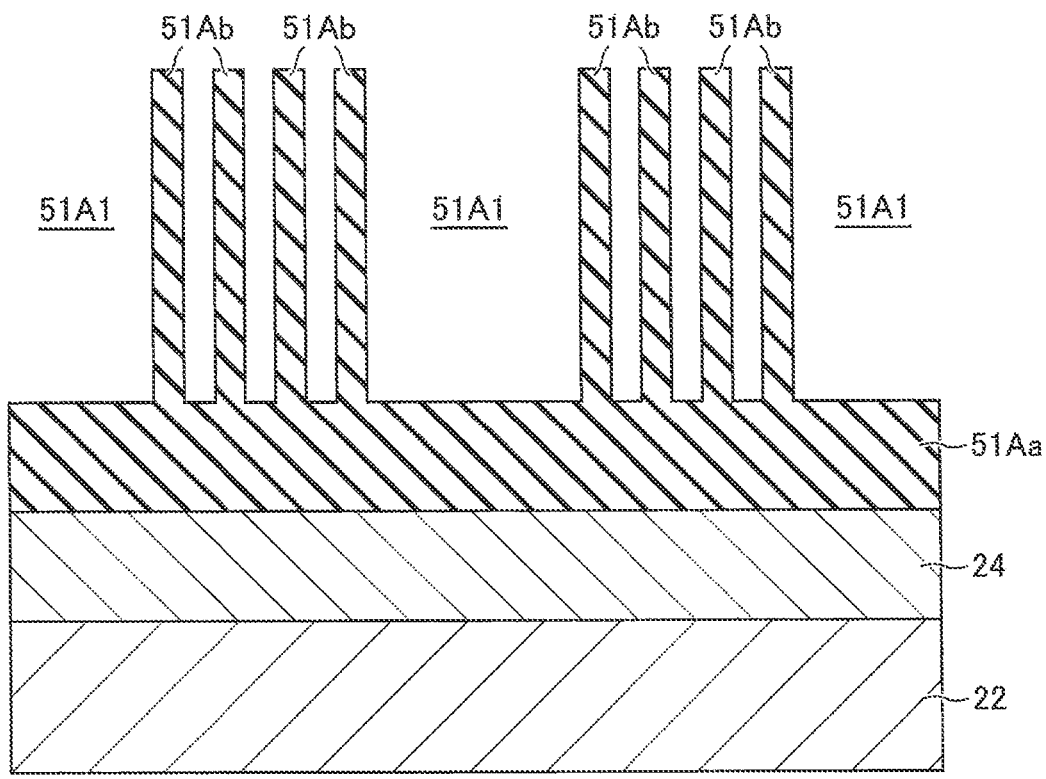
FIG. 20 shows a structure at a point in time subsequent to that shown in FIG. 19.

As shown in FIG. 20, the variable resistance material 51A is partially removed and openings 51A1, and thereby a first part 51Aa and a plurality of second parts 51Ab of the variable resistance material 51A are formed through the same step as that shown in FIG. 8 of the first embodiment. The first part 51Aa and the second parts 51Ab respectively correspond to the parts slated to be processed into the first part 51a and second parts 51b of the variable resistance material 51 in a later stage.

Figure 21:
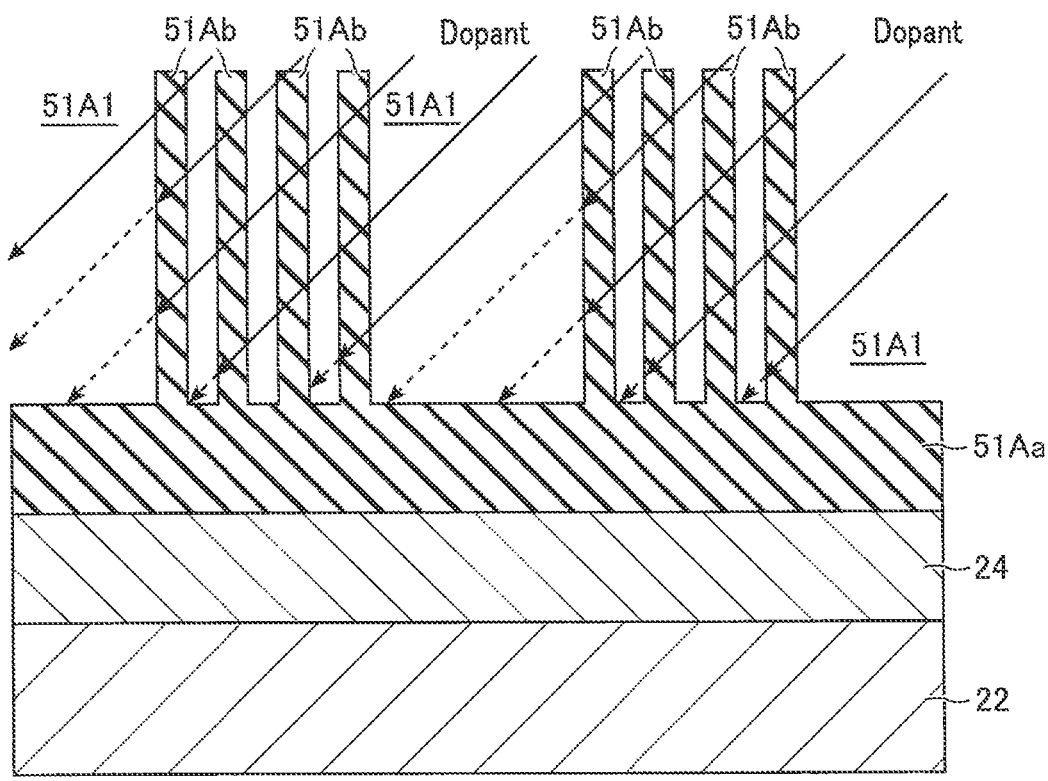
FIG. 21 shows a structure at a point in time subsequent to that shown in FIG. 20.

As shown in FIG. 21, a dopant is introduced by ion implantation into the structure obtained through the steps so far, similar to the step shown in FIG. 9 of the first embodiment. The ion implantation is performed using relatively little energy. For this reason, after entering the second parts 51Ab of the variable resistance material 51A, the dopant slows down to a great extent and remains in the second parts 51Ab. Part of the dopant passes through a given second part 51Ab and enters a next second part 51Ab, and remains therein. Since the energy used in the ion implantation is relatively little as described above, the majority of the dopant ceases moving within a second part 51Ab that the dopant enters, first, or within a second part 51Ab that the dopant enters second (the second part 51Ab next to the second part 51Ab which was entered first). In other words, ion implantation is performed using energy that allows for the majority of the dopant to stop within the second parts 51Ab first or second, to based on dimensions of the second parts 51Ab. For this reason, most of the dopant does not reach the first part 51Aa, as indicated by the dotted line in the drawing. Thus, hardly any, or no dopant, is introduced to the first part 51Aa.

The ion implantation is performed, with a targeted structure being rotated around the z-axis, as described earlier with reference to FIG. 9. For this reason, the dopant is introduced to the area not located on a line extended from the solid-line arrows in FIG. 21.

Figure 22:
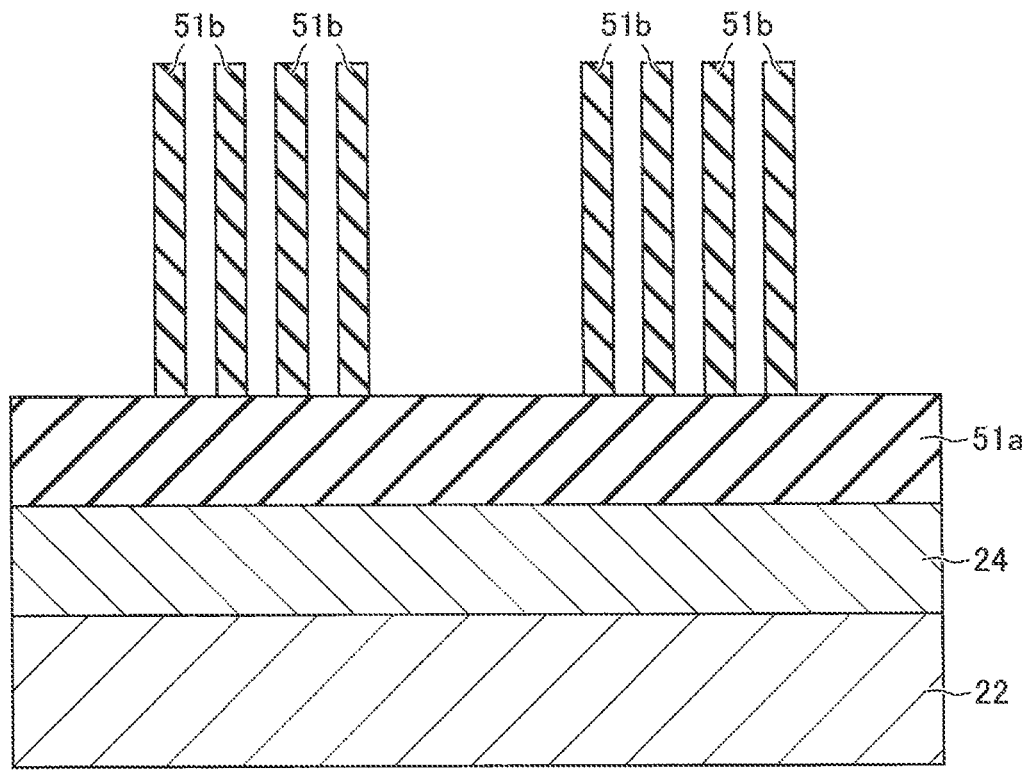
FIG. 22 shows a structure at a point in time subsequent to that shown in FIG. 21.

As shown in FIG. 22, as a result of dopant implantation, the variable resistance material 51A is formed into a variable resistance material 51. In other words, the area where a large amount of the dopant remains in the variable resistance material 51A becomes a second part rib of the variable resistance material 51. On the other hand, of the variable resistance material 51A, the area with almost no dopant introduced becomes a first part 51a of the variable resistance material 51.

As shown in FIG. 23, an insulator 29 is formed through the same step shown in FIG. 11 of the first embodiment. Subsequently, through the same step as that shown in FIG. 12 of the first embodiment, an upper electrode 27A, a ferromagnetic layer 31A, an insulating layer 32A, a ferromagnetic layer 33A, and a hardmask 35A, are deposited in this order on the upper surfaces of the second parts 51b of the variable resistance material 51 and the upper surface of the insulator 29.

As shown in FIG. 17, the ferromagnetic layers 31, the insulating layers 32, the ferromagnetic layers 33, and upper electrodes 27 are formed through the same step as that shown in FIG. 13 of the first embodiment. Subsequently, the insulator 30, the side-wall insulator 36, and the conductor 21 are formed.

2.3. Advantages

According to the second embodiment, similarly to the first embodiment, the variable resistance material 51A is formed into a plurality of variable resistance materials 51 through RIE in advance of introduction of a dopant, and the dopant is thereafter introduced into the variable resistance materials 51. Therefore, the same advantages as those of the first embodiment can be obtained.

Furthermore, according to the second embodiment, it is possible to provide a magnetoresistance memory device 1 including switching elements SEB with fewer variations in characteristics, as will be described below.

FIG. 24 shows a state change of the variable resistance material 125B and the variable resistance material 125 in a manufacturing process of a reference magnetoresistance memory device. The left side of FIG. 24 shows a state immediately after the step of FIG. 14. As shown in FIG. 24, the dopant is almost uniformly distributed over the entire variable resistance material 125B. FIG. 24 shows an example where the dopant is uniformly distributed in the entire variable resistance material 125B to facilitate better understanding.

The right side of FIG. 24 shows a state of the variable resistance material 125 after a subsequent process is performed. The subsequent process includes a formation of second part 125b of the variable resistance material 125 by partial removal of the variable resistance material 125B, a formation of a magnetoresistance effect element similar to a magnetoresistance effect element VR, and an annealing process at a high temperature.

An annealing process after second parts 125b of the variable resistance material 125 are formed may encourage movement of the dopant in the second parts 125b, and result in the forming of dopant clusters. The presence of dopant clusters renders the distribution of the dopant concentration in the second part 125b is non uniform, and an area exists in which the dopant exists at a low concentration. Dopant clusters allow for a current to flow easily; on the other hand, an area where the dopant exists at an extremely low concentration allows for hardly any or no current to flow. The nonuniformity in the dopant concentration differs among the second parts 125b, causing variations in characteristics among the second parts 125b, and in turn, variations in characteristics among switching elements.

According to the second embodiment, the variable resistance material 51 includes a plurality of second parts 51b arranged separate from each other in the lower portion of each magnetoresistance effect element VR. The width of each second pat 51b is small, and an insulator 29 that contains hardly any or no dopant is located between adjacent second parts 51b. For this reason, even in the case where dopant clusters are formed in second parts 51b containing the dopant at a high concentration, the cluster formation is inhibited by the insulator 29 containing a dopant at a lower concentration, and expansion of these clusters along the x axis beyond the second parts 51b where the clusters are formed is inhibited. This, in turn, inhibits limitless progress of dopant cluster formation, which consequently inhibits variations in the dopant cluster formation among a plurality of second parts 51b. For this reason, it is possible to inhibit variations in characteristics among the switching elements SEB.

The smaller the width of a second part 51b on the x axis is, the more the movement of the dopant therein is inhibited; as a result, dopant cluster formation is inhibited. Thus, the smaller the width of the second part 51b on the x axis is, the more variations in characteristics among the switching elements SEB can be inhibited.

2.4 Modifications

Similar to the modification of the first embodiment, each variable resistance material 51 of different memory cells MC may be independent from another. FIG. 25 shows such an example, showing the same part shown in FIG. 17 in a cross section of a reference structure of a magnetoresistance memory device of a first modification of the second embodiment.

As shown in FIG. 25, the variable resistance material 51 does not include the first part 51a. In other words, each switching element SEB includes a second part 51b of the variable resistance material 51. Each second part 51b is located on the upper surface of the lower electrode 24.

The structure shown in FIG. 25 can be formed when the RIE in the step shown in FIG. 20 continues from the step described with reference to FIG. 20.

According to the first modification, it is possible to achieve the same advantageous effects as those achieved by the second embodiment.

Figure 26:
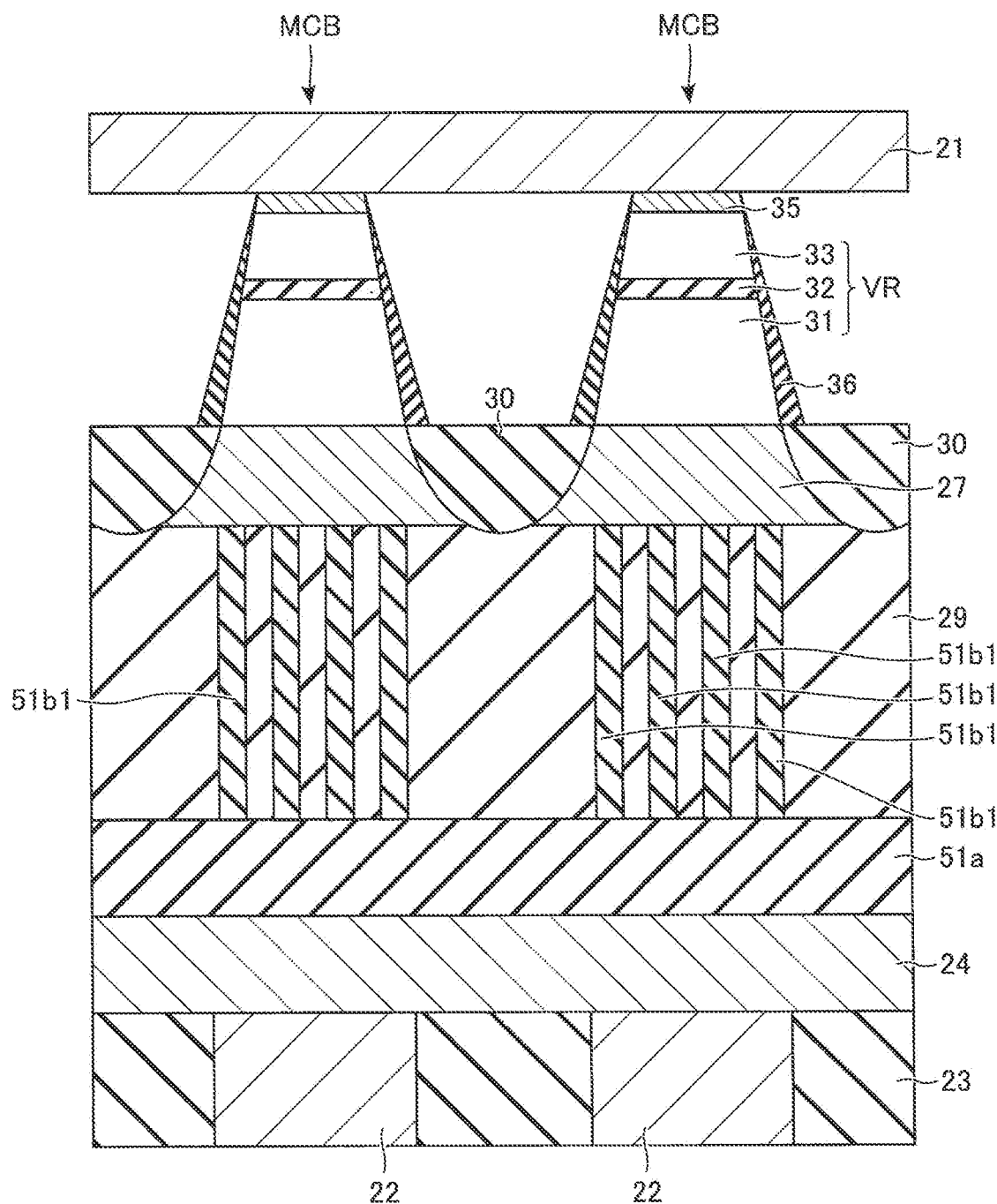
FIG. 26 shows a cross section of an exemplary structure of a magnetoresistance memory device of a second modification of the second embodiment.

The second part 51b of the variable resistance material 51 may be further divided along the y axis. FIG. 26 shows such an example, showing the same part shown in FIG. 18 in a cross section of a reference structure of a magnetoresistance memory device of a second modification of the second embodiment.

As shown in FIG. 26, the second part 51b includes a plurality of second sub-part 51b1 arranged along the y axis. The second sub-parts 51b1, on the xy plane, have a shape which is not elongated along the x or y axis, and are arranged in a matrix. However, the second sub-parts 51b1 are neither necessarily arranged in a matrix and nor in a shape of a column. Both of a column-shaped second sub-part 51b1 and the second part 51b extending along the y axis may be provided within a single switching element SEB.

According to the second modification, it is possible to inhibit the progress of the dopant cluster formation along the y axis.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistance memory device comprising:
   a first conductor;
   a silicon oxide on the first conductor, the silicon oxide including a dopant and having a first part on the first conductor and a second part adjacent to the first part on the first conductor, the second part being higher than the first part, a concentration of the dopant of the second part being higher than a concentration of the dopant of the first part;
   a second conductor on the second part of the silicon oxide; and
   a first layer stack on the second conductor, the first layer stack including a first magnetic layer, a second magnetic layer, and a first insulating layer between the first magnetic layer and the second magnetic layer.

2. The device according to claim 1, wherein:
   the silicon oxide further includes a third part adjacent to the first part on the first conductor,
   the first part is interposed between the second part and the third part,
   the third part is higher than the first part,
   a concentration of the dopant of the third part is higher than the concentration of the dopant of the first part, and
   the magnetoresistance memory device further comprises:
      a third conductor on the third part of the silicon oxide; and
      a second layer stack on the third conductor, the second layer stack including a third magnetic layer, a fourth magnetic layer, and a second insulating layer between the third magnetic layer and the fourth magnetic layer.

3. The device according to claim 2, wherein:
the first layer stack is positioned immediately above the second part of the silicon oxide, and
the second layer stack is positioned immediately above the third part of the silicon oxide.

4. The device according to claim 3, further comprising a first insulator being in contact with the second part and the third part of the silicon oxide on the first part of the silicon oxide and between the second part and the third part of the silicon oxide.

5. The device according to claim 1, wherein:
the first part of the silicon oxide includes a fourth part that includes a center and a fifth part that includes an area of a surface of the first part, and
a concentration of the dopant of the fourth part of the silicon oxide is lower than a concentration of the dopant of the fifth part of the silicon oxide.

6. The device according to claim 1, wherein:
the silicon oxide further includes a third part adjacent to the first part on the first conductor,
a concentration of the dopant of the third part is higher than the concentration of the dopant of the first part, and
the first layer stack is positioned immediately above the second part and the third part of the silicon oxide.

7. The device according to claim 6, further comprising a first insulator being in contact with the second part and the third part of the silicon oxide on the first part of the silicon oxide and between the second part and the third part of the silicon oxide.

8. The device according to claim 6, wherein:
the second part and the third part of the silicon oxide extend along a first axis and are arranged along a second axis, and
the second axis intersects the first axis.

9. The device according to claim 1, wherein the dopant is arsenic.

* * * * *